US006748200B1

(12) United States Patent
Webster et al.

(10) Patent No.: US 6,748,200 B1
(45) Date of Patent: Jun. 8, 2004

(54) AUTOMATIC GAIN CONTROL SYSTEM AND METHOD FOR A ZIF ARCHITECTURE

(76) Inventors: Mark A. Webster, 139 Island View Dr., Indian Harbor Beach, FL (US) 32937; Alex C. Yeh, 2805 Whistler St., West Melbourne, FL (US) 32904; Albert L. Garrett, 2370 Shady Oak Rd., Melbourne, FL (US) 32935

( * ) Notice: Subject to any disclaimer, the term of this patent is extended or adjusted under 35 U.S.C. 154(b) by 4 days.

(21) Appl. No.: 10/407,350

(22) Filed: Apr. 4, 2003

Related U.S. Application Data

(63) Continuation-in-part of application No. 09/677,975, filed on Oct. 2, 2000.
(60) Provisional application No. 60/453,905, filed on Mar. 11, 2003.

(51) Int. Cl.[7] .................................................. H04B 1/06
(52) U.S. Cl. ............................... 455/234.1; 455/232.1; 455/324; 455/296; 455/234.2; 375/345
(58) Field of Search .................... 455/232.1, 234.1, 455/234.2, 324, 323, 296, 313, 226.1, 341, 127.1–127.5, 250.1, 78; 375/341, 345

(56) References Cited

U.S. PATENT DOCUMENTS

| | | | |
|---|---|---|---|
| 5,175,749 A | 12/1992 | Ficht et al. | |
| 5,212,826 A | 5/1993 | Rabe et al. | |
| 5,483,691 A * | 1/1996 | Heck et al. | 455/234.2 |
| 5,617,060 A | 4/1997 | Wilson et al. | |
| 5,724,653 A | 3/1998 | Baker et al. | |
| 6,009,126 A | 12/1999 | Van Bezooijen | |
| 6,108,529 A * | 8/2000 | Vice et al. | 455/323 |
| 6,370,205 B1 | 4/2002 | Lindoff et al. | |
| 6,442,380 B1 * | 8/2002 | Mohindra | 455/250.1 |
| 6,459,889 B1 | 10/2002 | Ruelke | |
| 6,498,927 B2 * | 12/2002 | Kang et al. | 455/324 |
| 6,498,929 B1 | 12/2002 | Tsurumi et al. | |
| 6,504,498 B1 | 1/2003 | O'Brien | |
| 6,504,884 B1 | 1/2003 | Zvonar | |
| 6,507,241 B1 | 1/2003 | Ritter | |
| 6,507,732 B1 | 1/2003 | Dajer et al. | |
| 6,509,777 B2 | 1/2003 | Razavi et al. | |
| 6,516,183 B1 | 2/2003 | Hellmark | |
| 6,516,185 B1 * | 2/2003 | MacNally | 455/234.1 |
| 6,516,187 B1 | 2/2003 | Williams et al. | |
| 2002/0123319 A1 * | 9/2002 | Peterzell | 455/296 |

* cited by examiner

*Primary Examiner*—Edward F. Urban
*Assistant Examiner*—Lana Le
(74) *Attorney, Agent, or Firm*—Gary R Stanford

(57) ABSTRACT

A system and method for controlling amplification of a signal received by a ZIF radio having a power level within a full power range relative to a minimum noise floor. The ZIF radio includes a ZIF receiver front end, an overload detector, an ADC, a saturation detector, a DC and power estimator, and control logic. The control logic utilized full visibility of the ADC to limit gain of the baseband amplifier to a maximum gain setting sufficient to view the minimum noise floor and to view a received signal having a power level within any of several segments of the power spectrum. The segmentation of the power spectrum is based on an overload condition of the ZIF receiver front end and a saturation condition of the ADC. The control logic further employs limited gain stepping of the baseband amplifier to avoid exceeding a DC budget of the ADC.

30 Claims, 9 Drawing Sheets

AUTOMATIC GAIN CONTROL SYSTEM AND METHOD FOR A ZIF ARCHITECTURE

CROSS-REFERENCE TO RELATED APPLICATION(S)

The present application is based on U.S. Provisional Patent Application entitled "Automatic Gain Control System and Method For A ZIF Architecture", Ser. No. 60/453,905, filed Mar. 11, 2003, which is hereby incorporated by reference in its entirety. The present application is also a continuation-in-part of co-pending and commonly assigned U.S. patent application entitled "A Calibrated DC Compensation System For A Wireless Communication Device Configured In A Zero Intermediate Frequency Architecture", Ser. No. 09/677,975, filed Oct. 2, 2000, which is hereby incorporated by reference in its entirety.

FIELD OF THE INVENTION

The present invention relates to wireless communications, and more particularly to an automatic gain control system and method for a wireless communication device configured in a zero intermediate frequency (ZIF) architecture that utilizes a DC control loop to enable direct conversion of radio frequency signals to baseband frequency and a gain procedure that more accurately determines and controls DC voltage levels.

DESCRIPTION OF RELATED ART

The present invention is described in relation to a transceiver employed in a wireless local area network (WLAN) configuration. It is understood, however, that the present invention is not limited to WLAN configurations, but instead may be employed in other types of radio or wireless communications for other types of applications. A Zero Intermediate Frequency (ZIF) architecture is a wireless transceiver implementation that is utilized to obtain sufficient performance and higher data throughput at lower cost and power consumption. This is particularly advantageous to the consumer market which demands multimedia and DVD applications requiring relatively good performance. The consumer market also demands a lower cost. The ZIF architecture is one way to achieve lower cost with sufficient performance by eliminating IF components and external filters. The target carrier frequencies are in the GHz range such as 2–5 GHz ranges and higher, although the present invention is not limited to any particular frequency range. The 2–5 GHz bands are relatively noisy with significant amounts of interference. The ZIF architecture is utilized to maintain a level of performance in a noisy environment.

In wireless receiver implementations, including ZIF architectures, variable gain radio front ends are used to enable reception of the range of signal levels possible in the system. An Automatic Gain Control (AGC) procedure is often used to control the gain of a baseband AGC amplifier in response to incident signals to achieve a target gain level for baseband (BB) processing. The AGC procedure and the radio parameters are first configured to enable the analog to digital converter (ADC) within the baseband processor to see the noise floor of the wireless medium. The AGC procedure then detects and locks onto transmitted signals, where the gain parameters are changed so that an incoming signal larger than the noise floor can be seen by the ADC without undue impairments. At the end of the signal, the radio gain parameters are then re-configured so that the noise floor is again visible to the ADC. These relatively simple actions become more complicated when operating with a ZIF architecture. While many possible configurations exist for radio front ends, the ZIF architecture is attractive due to its low component count. ZIF architectures, however, suffer from excessive DC components and DC can be adversely impacted by poor AGC control. Because the DC voltage levels can become excessively large in the ZIF radio, the signals of interest become invisible and difficult to detect and acquire.

The primary problem with the ZIF architecture is the development of DC offsets at baseband that degrade signal-to-noise ratio (SNR), which is directly related to performance of the system. The IF stage, which may be utilized to combat a significant level of DC offset, is not provided in the ZIF architecture. A number of sources of DC offset are due to many factors, including variations in circuit matching, and temperature drifts or changes caused by die self-heating of integrated circuits. All of the sources of DC offset are referenced to the input of the baseband amplifier in the baseband signal path of the receive signal processing chain. The gain range of the baseband amplifier must be sufficient to guarantee acceptable performance in a variety of environments. The gain range of traditional baseband amplifiers has been configured to operate at gain levels over 50 dB, for example, which was believed necessary to obtain the desired operating range. It has been determined, however, that at such high gains (50 dB or more), increasing the gain by 10 dB may increase DC from 500 millivolts (mV) to 5 V, which is an increase of over 4 V. The ADC, however, is generally limited to a relatively small voltage range (e.g., approximately 0.5 V), so that excessive DC overwhelms the loop and causes instability and potential operation failure.

It is noted that one possible solution of removing DC offset is through AC coupling, such as using coupling capacitors or the like. However, AC coupling results in filtering that tends to filter out low frequency content. The amount of data thrown away becomes significant above 1 kHz, so that AC coupling must only filter below 1 kHz. Within this range, however, the settling time is too long, such as on the order of approximately 100 microseconds ($\mu$s), which is not practical in a bursty environment such as packet-based communications. The settling time is limited due to the bursty nature of communication. Short preamble time lines of IEEE 802.11a, b and g standards have little room for accurate DC estimation.

Another possible solution is to measure DC, and if larger than a predetermined level associated with ADC full scale (e.g., 500 mV), remove the full scale amount and let the correction settle through the radio. This procedure is repeated as often as necessary until the DC level is reduced and the signal is visible at the output of the ADC. While this appears to be a viable solution and has been used in the past, it required a significant amount of time. The iterative solution just described required as much as 20 microseconds ($\mu$s) or more in many configurations. For an 802.11a implementation, however, the maximum allowed time to measure and eliminate DC is about 5 to 6 $\mu$s. The AGC procedure must be configured to conserve time, which is a valuable commodity in a wireless transceiver.

It is desired to provide low cost and low power wireless communication devices for any type of wireless system and any type of application. The system must be relatively robust with significant performance and be capable of significant data throughput, including the higher data throughputs associated with newer or otherwise faster wireless standards, such as, for example, the 802.11a and 802.11g standards for WLAN communications.

SUMMARY OF THE INVENTION

A method of controlling amplification of a signal received by a ZIF radio having a power level within a predetermined full power range relative to a predetermined minimum noise floor according to an embodiment of the present invention includes amplifying the received signal using a baseband amplifier with a plurality of gain settings, converting the received signal to a digital signal using an analog to digital converter (ADC), and controlling the amplifying of the received signal for tracking noise floor and for attempting to acquire the received signal while limiting DC change within an available DC budget of the ADC. The controlling includes obtaining actual noise floor level by setting gain up to a maximum gain level within a first story power range at a lower end of the full power range sufficient for the ADC to view the minimum noise floor, detecting an overload condition and switching gain in a single gain step to within a third story power range at an upper end of the full power range sufficient for the ADC to view the received signal, and detecting a saturation condition of the ADC and switching gain in a single gain step to within a second story power range between the first and second story power ranges sufficient for the ADC to view the received signal.

The obtaining actual noise floor level may include switching the baseband amplifier up to a predetermined maximum gain setting using limited gain stepping to avoid exceeding the DC budget of the ADC. The method may further include settling after each of the switching, measuring DC of the digital signal and subtracting measured DC from the received signal, and after a final of the switching and settling, measuring power level of the digital signal.

The method may further include detecting a signal trigger condition in which power level is increased over the actual noise floor by at least a predetermined signal trigger threshold, measuring power level and DC level of the digital signal in response to detecting any one of the overload, saturation and signal trigger conditions, switching the baseband amplifier and subtracting DC from the received signal and settling if measured power level of the digital signal is greater than a predetermined target back-off power level of the ADC, verifying power level and measuring DC level of the digital signal, and subtracting any remaining DC offset from the received signal and settling.

The method may further include digitally amplifying the digital signal to achieve a power level equivalent to the target back-off power level of the ADC. The method may further include using an RF amplifier with high and low gain settings set to high gain for weak signals and switched to low gain for strong signals.

A ZIF radio for detecting an RF signal within a predetermined power spectrum relative to a predetermined minimum noise floor according to an embodiment of the present invention includes a ZIF receiver front end, an overload detector, an ADC, a saturation detector, a DC and power estimator, and control logic. The ZIF receiver front end converts the RF signal to a baseband signal and includes a baseband amplifier. The overload detector detects an overload condition of the ZIF receiver front end in which the RF signal is within an upper power range of a predetermined power spectrum and asserts an overload signal indicative thereof. The ADC converts the baseband signal to a digital baseband signal. The saturation detector detects a saturation condition of the ADC in which the RF signal is within a middle power range of the power spectrum and provides a saturation signal indicative thereof. The DC and power estimator estimates DC and power level of the digital baseband signal and provides estimation signals indicative thereof. The control logic limits gain of the baseband amplifier to a maximum gain setting sufficient for the ADC to view a lower power story including the minimum noise floor of the power spectrum, monitors the saturation, overload and estimation signals, and switches gain of the baseband amplifier once to place the received signal within view of the ADC in the event of either one of the overload and saturation conditions.

A processing system with wireless communications according to an embodiment of the present invention includes a processor, a memory, and a ZIF transceiver that detects RF signals within a predetermined full power spectrum. The ZIF transceiver includes a ZIF receiver front end, an ADC, a saturation detector, an overload detector, a joint DC and power estimator, and AGC/DC control logic.

BRIEF DESCRIPTION OF THE DRAWINGS

A better understanding of the present invention can be obtained when the following detailed description of embodiment(s) of the present invention is considered in conjunction with the following drawings, in which.

DETAILED DESCRIPTION OF EMBODIMENT(S) OF THE INVENTION

Figure 1:
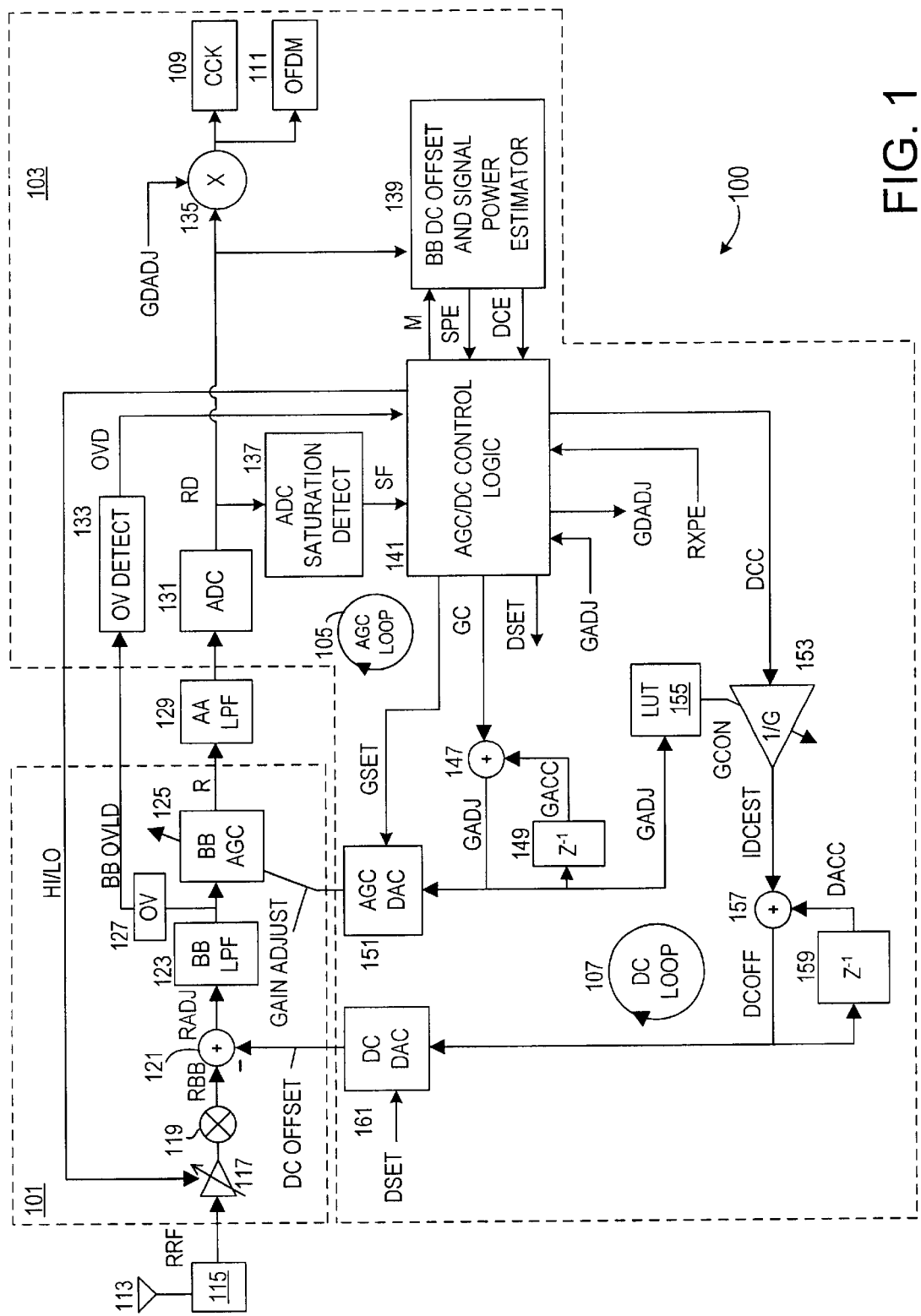
FIG. 1 is a simplified schematic and block diagram of a ZIF wireless receiver implemented according to an embodiment of the present invention for use in a WLAN.

FIG. 1 is a simplified schematic and block diagram of a zero intermediate frequency (ZIF) wireless receiver 100 implemented according to an embodiment of the present invention for use in a Wireless Local Area Network (WLAN). It is understood, however, that the wireless receiver 100 is not limited to WLAN configurations, but instead may be employed in other types of radio or wireless communications for other types of applications. The wireless receiver 100 is the receive portion of a wireless transceiver that includes corresponding transmitter circuitry (not shown). The wireless receiver 100 may be designed in any one of several configurations, including, for example, personal computers, laptop computers, desktop computers, etc., printing devices including any type of printer technology, personal digital assistants (PDAs) or the like, scanners, fax machines, etc. The wireless receiver 100 may be configured as a plug-in peripheral or expansion card that plugs into an appropriate slot or interface of a computer system. For example, for portables and laptop computers and the like, the wireless receiver 100 may be implemented as a Personal Computer Memory Card International Association (PCMCIA) card or PC Card that plugs into a PC Card slot of the computer. For desktop computers and the like, the wireless receiver 100 may be implemented according to any type of expansion or peripheral standard, such as according to the peripheral component interconnect (PCI), the Industry Standard Architecture (ISA) or the like, etc. For example, the wireless receiver 100 may be implemented on a PCI card that plugs into a PCI slot. An antenna 113 is provided to transmit and receive RF signals, where the antenna 113 is incorporated within a product or externally coupled. For example, one or more antennas may be incorporated on a PC Card, or provided externally or on a computer and interfaced to the PC Card in any appropriate manner. Mini PCI cards with antennas embedded in displays are also contemplated. Self-contained or standalone packaging with an appropriate communication interface is also contemplated, which is particularly advantageous for access points (APs) or the like. For example, the wireless receiver 100 may be implemented as a separate unit with serial or parallel connections, such as a Universal Serial Bus (USB) connection or an Ethernet interface (twisted-pair, coaxial cable, etc.), or any other suitable interface to the device.

The wireless receiver 100 is implemented as a ZIF architecture including a ZIF receiver front end 101 and a baseband processor 103. Only portions of the ZIF receiver front end 101 and baseband processor 103 are shown detailing the AGC and DC control, whereas additional BB processing and transmitter portions are omitted as not necessary for a complete understanding of the present invention. As described more fully below, the ZIF architecture enables a simplified configuration by entirely eliminating intermediate frequency (IF) logic and associated circuitry. In this manner, a ZIF radio may be implemented using only two primary modules, chips, or ICs (transceiver and processor) to enable wireless communications. This, in turn, significantly reduces the number of components, reduces cost and further reduces power consumption of the wireless receiver 100 as compared to similar transceivers including IF circuitry and logic.

A problematic characteristic of traditional ZIF architectures is the introduction of substantial DC offset voltages in the receiver that must be compensated for or otherwise eliminated to capture incoming signals and allow communications. The wireless receiver 100 is configured with an automatic gain control (AGC) loop 105 combined with a DC loop 107 to measure and reduce or otherwise eliminate undesired DC in the baseband signal path of the receiver. As described further below, the AGC loop 105 includes gain control logic that receives an amplified input signal, that estimates input signal power and that asserts a gain adjust signal in an attempt to keep the input signal power at a target power level. The DC loop 107 includes DC control logic that estimates an amount of DC in the amplified input signal and that provides a DC offset that is subtracted from the baseband signal path in an attempt to reduce DC in the baseband signal. Also, in the particular embodiment shown, a gain interface is provided between the AGC loop 105 and the DC loop 107 that converts gain levels between the gain control logic and the DC control logic.

The wireless receiver 100 may utilize any desired carrier frequency and modulation technique to achieve any of several corresponding data throughputs. For example, the wireless receiver 100 may be configured to operate according to the Institute of Electrical and Electronics Engineers (IEEE) 802.11b with a carrier frequency of approximately 2.4 gigahertz (GHz) and with data rates of 1, 2, 5.5 or 11 Megabits per second (Mbps). Alternatively, the wireless receiver 100 may be configured to operate according to the IEEE 802.11a with a carrier frequency of approximately 5 GHz or according to the IEEE 802.11g with a carrier frequency of 2.4 GHz for data rates of 6, 12, 18, 24, 36 or 54 Mbps. Multi-mode and multi-band radios are contemplated in which the wireless receiver 100 is configured to send and receive packets according to multiple standards. In the embodiment shown, for example, the wireless receiver 100 includes a CCK processor 109 for receiving packets according to 802.11b and an OFDM processor 111 for receiving packets according to 802.11a or 802.11g.

Figure 8A:
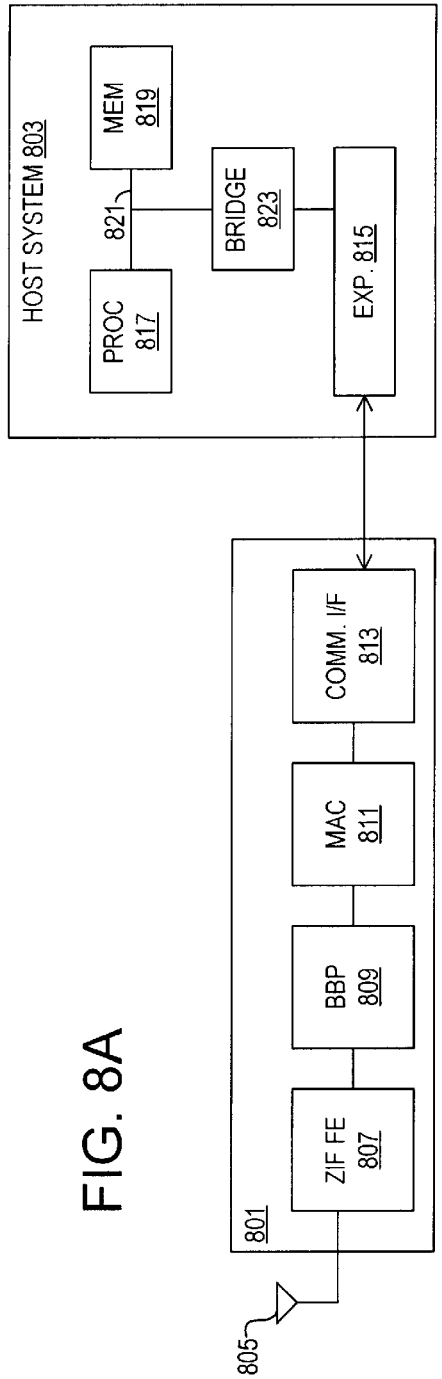
FIG. 8A is a simplified block diagram of a ZIF wireless transceiver configured as an expansion unit for coupling to a host computer system via an appropriate expansion slot on the host system.

Digital data sent from or received by the wireless receiver 100 is processed through a medium access control (MAC) device 811 (FIG. 8A). For transmission, the MAC device asserts digital data signals to a packet encoder (not shown), which formulates the data into packets for transmission. 1 and 2 Mbps bit rates are encoded according to Barker word encoding spreading, whereas the 5.5 and 11 Mbps bit rates are encoded according to Complementary Code Keying (CCK) encoding. In an OFDM configuration, multiple subcarrier signals are incorporated within each OFDM symbol. Data is incorporated on each data tone using a selected modulation scheme, such as Binary Phase Shift Keying (BPSK), Quadrature PSK (QPSK), 16 Quadrature Amplitude Modulation (QAM), and 64 QAM. Each of the modulation schemes employs a corresponding constellation map with variable constellation points corresponding to a corresponding variable number of bits for achieving the various data rates. For example, BPSK is used for 6 or 9 Mbps, QPSK is used for 12 or 18 Mbps, 16 QAM is used for 24 or 36 Mbps, and 64 QAM is used for 48 or 54 Mbps. The encoding process employs a quadrature generation technique and provides in phase (I) and quadrature (Q) signals on respective I and Q channels. The embodiments illustrated are simplified in that only one channel is shown, where it is understood that each channel is configured in a substantially similar manner. The respective channels are converted to analog, filtered, mixed, combined, amplified, and filtered again to modulate and transmit an RF signal into the wireless medium via the antenna (or a similar antenna if antenna diversity is used).

The antenna 113 is shown coupled to an antenna interface 115, which incorporates one or more receive path components depending upon the particular configuration as known to those skilled in the art. For example, the antenna interface 115 may include a diversity switch (not shown) for selecting among multiple antennas in the event antenna diversity is employed, an RX band pass filter (BPF) (not shown) to filter the received in accordance with the selected band of operation (e.g., 2.4, 5 GHz), a T/R switch (not shown) for switching between transmit and receive, a balanced/unbalanced (BALUN) impedance matching network (not shown), etc. The antenna interface 115 provides a received RF input signal RRF to the input of a variable low noise amplifier (LNA) 117 of the ZIF receiver front end 101, having an output coupled to the input of an RF mixer circuit 119. The LNA 117 receives a HI/LO signal for switching its gain between a predetermined high (HI) gain value and a predetermined low (LO) gain value depending upon the signal strength of the RRF signal. As described further below, the LNA 117 is an RF amplifier initially set to the HI gain level to ensure detection of weak RF signals during noise floor tracking, and is switched to LO gain if a strong RF signal is detected. In an exemplary embodiment, the high gain level is approximately 32 decibels (dB) and the low gain is approximately 6 dB. The mixer circuit 119 incorporates separate I and Q channel mixers (not shown) to remove the RF carrier and to convert the RRF signal from RF to an analog baseband signal RBB. It is appreciated that the RBB signal represents either or both of the I and Q channel signals, although only one channel is shown and described since both channels are handled in substantially the same manner.

The mixer circuit 119 provides the baseband receive input signal RBB to one input of a combiner 121 (e.g., adder), which provides a DC-adjusted receive input signal RADJ to the input of a baseband BB low-pass filter (LPF) 123 for filtering the received signal. The other input of the combiner 121 receives a DC OFFSET signal. The combiner 121 combines the DC OFFSET signal with the RBB receive signal to provide the DC-adjusted RADJ signal. In one embodiment, the combiner 121 is a summing junction that subtracts the DC OFFSET signal from the RBB receive signal to provide the RADJ signal. It is noted that the combiner 121 may alternatively operate as a summing junction that adds an inverted DC OFFSET signal. The present invention is not limited to any particular details of implementation, signal orientations or design configurations. The output of the BB LPF 123 is provided to the input of a baseband amplifier (BB AGC) 125 and to an overload (OV) sensor 127. The baseband amplifier 125 amplifies the received signal based on an analog GAIN ADJUST signal and outputs an amplified received signal R. The overload sensor 127 senses an overload condition, (e.g., over-voltage or high powered signal condition), and asserts a baseband overload (BB OVLD) signal to an overload detect circuit 133 within the baseband processor 103. The overload (OV) detect circuit 133 asserts an overload detect signal (OVD) indicative of the overload condition of the baseband signal at the output of the BB LPF 123. If the LNA 117 is initially set to HI gain and the overload sensor 127 detects a strong received signal such that the initial gain is too high, the overload detect circuit 133 asserts the OVD signal indicative of overload, and the gain is reduced by asserting the HI/LO signal to LO gain as further described below. Also, as described further below, the OVD signal is used as a flag or interrupt indicative of the approximate gain range of the received signal for controlling the gain of the baseband amplifier 125.

The baseband amplifier 125 of the ZIF receiver front end 101 asserts the amplified input signal R to the input of an anti-aliasing low-pass filter (AA LPF) 129, which asserts a filtered signal to an analog to digital converter (ADC) 131 of the baseband processor 103. The ADC 131 provides a digital version of the amplified receive input signal R at its output, where the digital received signal is referred to as RD. The resolution or number of bits of the ADC 131 depends upon the particular configuration and expected signal types to be received. For example, in an 802.11a application, the ADC is sized to sufficiently distinguish 64 QAM signals which typically require relatively large signal-to-noise ratio (SNR) (e.g., such as an SNR greater than 18 dB). In the embodiment shown in which 802.11a and 802.11g signal types are contemplated, the ADC 131 includes 8–10 actual bits, although it is appreciated by those of ordinary skill in the art that the "effective" number of bits may be less, such as 7 effective bits or the like. The AGC loop 105 is generally configured to control the gain of the RD signal to a target back-off power level appropriate for the ADC 131. In one embodiment, for example, the AGC loop 105 is configured such that the signal of interest has an average signal level of 12 dB below full-scale of the ADC 131 to provide sufficient resolution and head-room.

As described further below, however, the otherwise "normal" operation of the AGC loop 105 to get to the target back-off power level (e.g., −12 dB relative to full scale of the ADC 131) is modified when receiving weak signals in that the maximum gain of the baseband amplifier 125 is limited to a predetermined maximum gain setting to prevent excessive DC. Thus, the power level of the RD signal may be lower than the target back-off power level desired for optimal bit sizing in the receive chain, including, for example, the CCK processor 109 and the OFDM processor 111. The RD signal is provided to one input of a digital gain amplifier 135, which adjusts the gain according to a digital gain adjust signal GDADJ received at another input. The output of the digital gain amplifier 135 is provided to the inputs of the CCK and OFDM processors 109, 111 in the receive chain. The digital gain amplifier 135 provides a digital gain component to provide an additional 15 dB of gain beyond the maximum gain setting of the baseband amplifier 125. In this manner, when the total gain of the ZIF receiver front end 101 is at the predetermined maximum gain level and additional gain is otherwise needed to attain the target back-off power level, the digital gain amplifier 135 provides the additional gain up to 15 dB.

The RD signal is provided to an ADC saturation detector 137 and to a BB processor DC offset and signal power estimator 139. The ADC saturation detector 137 detects saturation of the ADC 137 (e.g., substantial clipping) and provides a saturation flag (SF) signal indicative thereof to AGC/DC control logic 141. The BB processor DC offset and signal power estimator 139 is a joint DC and power estimator that provides a signal power estimate (SPE) signal and a DC estimate (DCE) signal to the AGC/DC control logic 141, which also receives the OVD signal from the overload detect circuit 133. In the illustrated embodiment, the BB processor DC offset and signal power estimator 139 incorporates one or more sample and power estimators controlled by a measurement signal M from the AGC/DC control logic 141 indicative of the type and accuracy of the power estimate desired. As described further below, the BB processor DC offset and signal power estimator 139 is configured to provide relatively short integration interval (short interval) measurements for quick and rough signal/DC measurements and longer integration interval (long interval) measurements for longer and more accurate signal/DC measurements.

The AGC/DC control logic 141 asserts a gain control signal GC to an adder 147 in the AGC loop 105 for controlling gain and a DC control (DCC) signal in the DC loop 107 for controlling the DC level. The GC signal is determined by several factors, including the current state of the ZIF receiver 100, the current gain setting of the baseband amplifier 125, the status of the OVD and SF signals, and the SPE signal, target power level(s), among other variables. The DCC signal is primarily derived from the DCE signal representing the measured DC level of the RD signal. The AGC/DC control logic 141 receives a receive packet end (RXPE) signal from other control logic (e.g., the MAC) upon detection of end of packet (EOP).

In the AGC loop 105, the GC signal is provided to one input of a combiner 147, which combines the GC signal with a gain accumulation signal GACC from an accumulator 149 to provide a digital gain adjust signal GADJ at its output. In one embodiment, the combiner 147 operates as a summing junction that subtracts the GC signal from the gain accumulation signal GACC from an accumulator 149 to provide the GADJ signal at its output. The GADJ signal is provided to the respective inputs of the AGC/DC control logic 141, an AGC DAC 151, the accumulator 149, and a look-up table (LUT) 155. The AGC DAC 151 converts the digital GADJ signal to the analog GAIN ADJUST signal, which controls the gain of the baseband amplifier 125. The accumulator 149 continuously or otherwise periodically adjusts the GACC signal to track changes of the GADJ signal. The AGC/DC control logic 141 receives the GADJ signal and develops the GDADJ signal provided to the digital gain amplifier 135. In one embodiment, the GADJ signal provided to the AGC DAC 151 and the LUT 155 is limited a value which limits the maximum gain of the baseband amplifier 125 to a maximum gain setting. In a specific embodiment, for example, the maximum gain setting of the baseband amplifier 125 is 38 dB, although this may vary depending upon design criterion and configurations. Additional logic or circuitry (not shown) may be included to cap the gain in this manner.

Although not specifically shown, the AGC/DC control logic 141 controls the GDADJ signal to be the maximum of 0 dB or the differential between GADJ and the value corresponding to the maximum gain setting. Thus, when the GADJ indicates a requisite gain less than or equal to the maximum gain setting, the GDADJ signal corresponds to a gain of 0 dB (no gain) for the digital gain amplifier 135, and when the GADJ indicates a requisite gain greater than the maximum gain setting, the GDADJ signal corresponds to a difference in gain above the maximum gain setting. For example, if the GADJ calls for a gain of 42 dB and if the maximum gain setting is 38 dB, then the GDADJ signal corresponds to a gain of 4 dB for the digital gain amplifier 135.

The AGC/DC control logic 141 asserts a digital value on gain set signals GSET to the AGC DAC 151 to over-ride the AGC loop 105 to directly set the gain of the baseband amplifier 125 to any desired value. Thus, the AGC/DC control logic 141 can directly set, and, if desired, hold the gain of the baseband amplifier 125 to any particular value. In a similar manner, the AGC/DC control logic 141 asserts a digital value on DC set signals DSET to the DC DAC 161 to over-ride the DC loop 107 to directly set the value of the DC OFFSET signal to any desired value. Thus, the AGC/DC control logic 141 can use the DSET signals to directly set the DC offset subtracted from the receive chain signal path to any particular value.

The AGC/DC control logic 141 monitors the OVD signal and asserts the HI/LO signal to the LNA 117. It is noted that the indication of the overload condition by the BB OVLD and/or OVD signals is filtered or otherwise conditioned to prevent undesired results such as false triggering or interference with signal acquisition. Such filtering may be provided within the overload detect circuit 133 or the AGC/DC control logic 141 or any suitable combination of both. In one embodiment, the AGC/DC control logic 141 does not immediately respond to assertion of the OVD signal by changing the state of the HI/LO signal from HI to LO, but instead filters the OVD signal based on a predetermined filter condition. For example, the filter condition may comprise majority logic or the like such that an overload condition is determined to exist if a sufficient number of samples of the OVD signal indicate the overload condition (e.g., if the OVD signal is sampled high 3 of 4 times or the like). The filter condition also incorporates timer functions to avoid changing state of the LNA 117 under certain conditions. For example, the OVD signal is ignored if it has not been asserted high after expiration of a certain amount of time after an AGC unlock event during noise floor tracking (indicating onset of a new packet), and is then ignored until after the next assertion of the RXPE signal indicative of EOP to avoid losing the packet. In one embodiment, for example, the OVD signal is ignored if asserted for the first time after the expiration of 3 $\mu$s after an AGC unlock event.

The DCC signal is provided to the input of a DC amplifier 153, which is adjusted by a gain conversion signal GCON output from the LUT 155. The DC amplifier 153 amplifies or attenuates (1/G) the DCC signal by an amount determined by the GCON signal from the LUT 155, and provides an input DC estimate signal IDCEST to one input of a combiner 157, which receives a DC offset accumulation signal DACC from an accumulator 159 at its other input. The combiner 157 combines the IDCEST signal with the DACC signal to provide a DC offset signal DCOFF, which is provided to the input of a DC DAC 161 and to the input of the DC accumulator 159. In one embodiment, the combiner 157 operates as a summing junction that adds the IDCEST signal to the DACC signal to provide the DCOFF signal. The accumulator 159 continuously adjusts the DACC signal to the level of the DCOFF signal to maintain an accumulated DC value. The DC DAC 161 converts the digital DCOFF signal to the analog DC OFFSET signal provided to the combiner 121 to subtract out DC voltage.

It is noted that many alternatives and variations are contemplated. For example, the combiner 121 may be implemented as a simple summing junction, where the DC amplifier 153 or the DC DAC 161 performs negation or inversion to generate a negative DC OFFSET signal, which is then added to the RBB signal by the combiner 121.

The LUT 155 is a memory device that stores predetermined gain conversion values which are asserted as the GCON signal to control the gain of the DC amplifier 153. For example, the GADJ signal is used as an address to access a corresponding gain conversion value within the LUT 155, which is then asserted as the GCON signal to the DC amplifier 153. Each gain conversion value programmed within the LUT 155 corresponds to at least one gain level or step of the AGC DAC 151. A separate gain conversion value for each gain step is contemplated, which provides an advantage during operation in that no conversion is necessary so that the LUT 155 supplies an appropriate GCON value for each and every possible GADJ value. Alternatively, each GCON value represents a corresponding range of GADJ values to enable use of a smaller memory. The gain conversion values in the LUT 155 may compensate for different gain ranges and/or different gain scales between the baseband amplifier 125 and the DC amplifier 153. In this manner, the IDCEST signal, asserted by the DC amplifier 153, represents an error of the DC OFFSET signal. The combiner 157 adjusts the DCOFF signal, maintained by the accumulator 159 as the DACC signal, by the IDCEST signal to compensate for errors in the DC OFFSET signal.

In the embodiment shown, the DC amplifier 153 is a linear gain amplifier. In general, the baseband amplifier 125 amplifies the input signal including any DC, so that the DC amplifier 153 operates as an amplifier that amplifies the DCC signal to maintain control of the DC loop 107. The amount of amplification by the DC amplifier 153 is controlled by the gain conversion value GCON from the LUT 155 as selected by the GADJ signals. The LUT 155 receives the GADJ signal and adjusts the GCON signal accordingly. The LUT 155 operates as a gain interface that converts gain levels between the gain control logic and the DC control logic. In one embodiment, each gain conversion value in the LUT 155 inverts the gain between the baseband amplifier 125 and the DC amplifier 153. The gain conversion values may further be selected to convert between the corresponding ranges or units along with any bit weighting of the GADJ and GCON signals so that the amplification of the DCC signal corresponds to the gain of the RADJ signal. In the alternative or in addition, the gain conversion values further convert between gain scales, such as between logarithmic and linear scales. In particular for the embodiment shown, since the baseband amplifier 125 is a logarithmic gain amplifier measured in decibels (dBs) and since the DC amplifier 153 is a linear gain amplifier, the gain conversion values in the LUT 155 convert from the GADJ signal in dBs to the linear gain GCON signal. For embodiments in which the baseband amplifier 125 and the DC amplifier 153 are both linear amplifiers, the gain conversion values convert between the corresponding ranges or units along with any bit weighting of the GADJ and GCON signals without need of logarithmic conversion.

Figure 2:
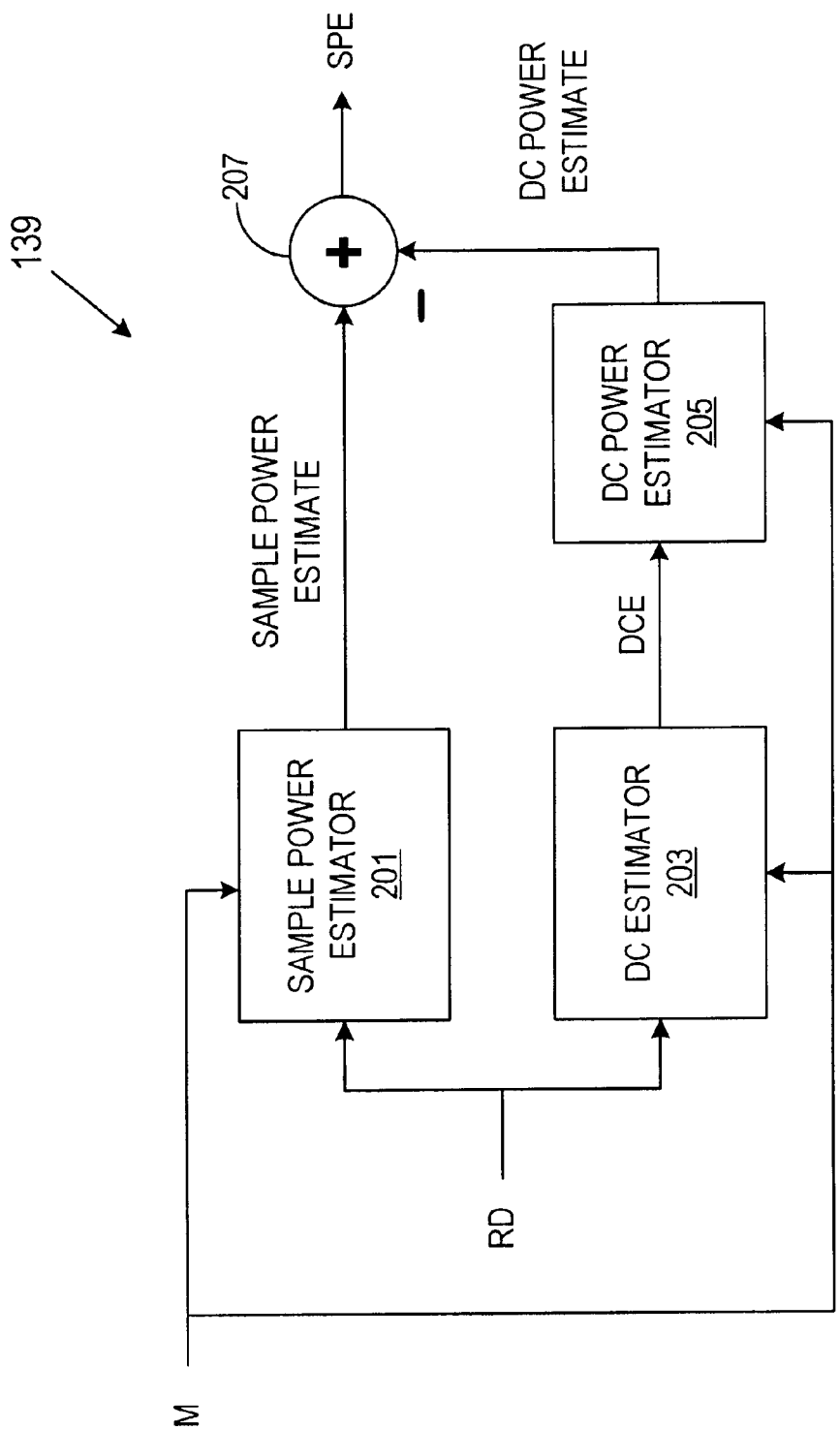
FIG. 2 is a more detailed block diagram of an exemplary embodiment of the BB DC offset and signal power estimator of FIG. 1.

FIG. 2 is a more detailed block diagram of an exemplary embodiment of the BB DC offset and signal power estimator 139. The signal RD, which is composed of digitized samples of the analog R signal, is coupled to a sample power estimator 201 and a DC estimator 203. The sample power estimator 201 provides a sample power estimate signal to one input of a subtractor 207. The DC estimator 203 generates and provides the DC estimate signal DCE to a DC power estimator 205, which provides a corresponding DC power estimate signal to an inverting input of the subtractor 207. The subtractor 207 subtracts the DC power estimate signal from the sample power estimate signal to generate the signal power estimate (SPE) signal. The M control signal from the AGC/DC control logic 141 is provided to the sample power estimator 201, the DC estimator 203 and the DC power estimator 205 to control the relative accuracy of the DC and power estimates, as described below. In one embodiment, for example, the AGC/DC control logic 141 dictates how many samples of the RD signal are processed for a given set of estimates.

In an exemplary embodiment, the sample power estimator 201 performs a mean square calculation of the samples of the RD signal as described according to the following equation 1:

$$SPE = 1/N \; SUM(k=1,N)[|X_k|^2] \qquad (1)$$

where the function SUM is a summing function for summing together a number of values according to an index value k incremented from 1 to N for each of N values to be summed together, N is the total number of samples to be processed, X is the value of the current sample value of the RD signal, and the "| |" symbols denote the absolute value function. In a similar manner, the DC estimator 203 performs a mean calculation of the RD signal samples according to the following equation 2:

$$DCE = 1/N \; SUM[X_k] \qquad (2)$$

The DC power estimator 205 performs a complex square calculation of the discrete DCE signal according to the following equation 2:

$$DC \; Power \; Estimate = |DCE_k|^2 \qquad (3)$$

where $DCE_k$ denotes discrete values of the DCE signal.

Figure 3:
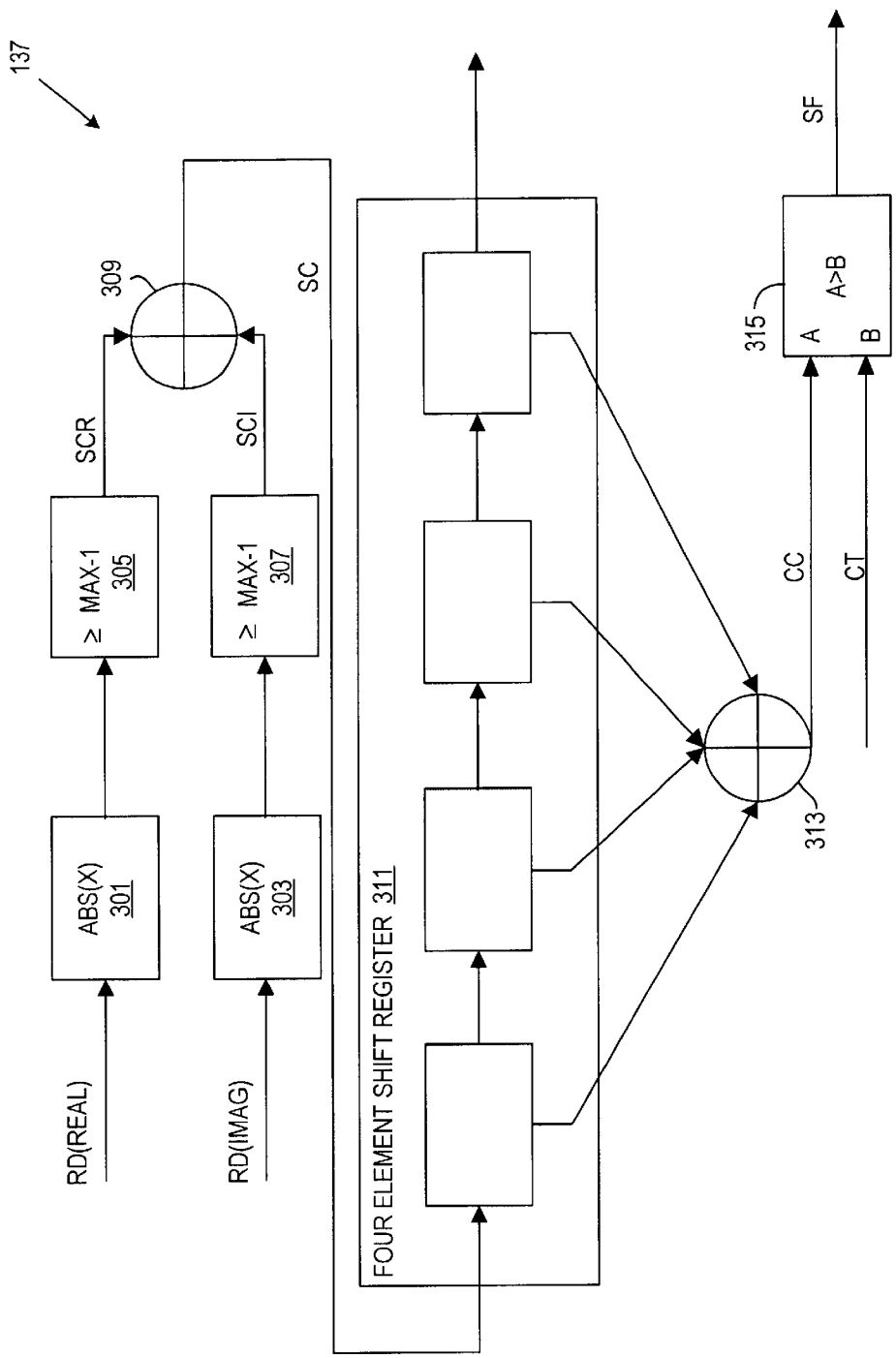
FIG. 3 is a more detailed block diagram of an exemplary embodiment of the ADC saturation detector of FIG. 1.

The AGC/DC control logic 141 asserts the M signal to dictate the number of samples of the RD signal employed in any given measurement to control the relative tradeoff between speed and accuracy. The AGC/DC control logic 141 then uses the resulting SPE and/or DCE estimate signals to control the AGC loop 105 and the DC loop 107, respectively, as further described below. In one embodiment, the short interval measurement is indicated by a small number of samples, such as, for example, 4 RD samples, to obtain a relatively quick rough or gross estimate of power and/or DC in approximately 200 nanoseconds (ns) (0.2 μs). The long interval measurement is indicated by a medium number of samples, such as, for example, 16 RD samples, to obtain a relatively accurate estimate of power and/or DC in approximately 800 ns (0.8 μs). It is appreciated that the rough estimates are employed to save time whereas the more accurate estimates are used when needed, such as when acquiring a transmitted signal for BB processing FIG. 3 is a more detailed block diagram of an exemplary embodiment of the ADC saturation detector 137. As can be appreciated, and as previously described, the signal RD represents both an I (REAL) and Q (IMAG) signal path. The two signal paths of signal RD are shown as a signal RD(REAL) and a signal RD(IMAG), which represent the real and imaginary signal components of the signal RD, respectively. The RD(REAL) signal is provided to an absolute value function (ABS) block 301 and the RD(IMAG) signal is provided to another, similar ABS block 303 (where "X" denotes signal samples as previously described). Each of the ABS blocks 301 and 303 computes the absolute value of the corresponding RD signal samples and provides the resulting values to comparator blocks 305 and 307, respectively. The absolute value of each RD(REAL) and RD(IMAG) signal is compared to a predetermined signal clip limit value MAX-1, described further below, where the comparison results from the comparator blocks 305 and 307 are provided as a saturation count real (SCR) and a saturation count imaginary (SCI) signal, respectively. The SCR and SCI signals are provided to respective inputs of a logical OR block 309, which outputs a saturation count (SC) signal comprising the logical OR of the signals SCR and SCI. The SC signal is indicative of whether or not the absolute value of either of the RD signals exceeds the signal clip limit value MAX-1.

The signal clip limit value MAX-1 is determined by the number of usable bits of the ADC 131. In an exemplary embodiment, the ADC 131 has 8–10 bits with possibly only 7 usable bits. In this embodiment, a value MAX would be the maximum value a number composed of 7 binary bits can achieve, or 128 (e.g. 1111111 binary=128 decimal). The SC signal is digitally shifted into a four element shift register 311. The shift register 311 has four elements in the present embodiment, although it is contemplated that more or less elements might be used as desired. The output of each of each of the four elements of the shift register 311 is coupled to a logic summer 313, which sums the four elements and outputs a corresponding clip count (CC) value. The CC value is provided to one input (A) of a comparator 315, and a predetermined clip threshold (CT) value is provide to another input (B) of the comparator 315. The comparator 315 compares the CC value to the CT value, and if CC is greater than CT, asserts the SF signal. In the present embodiment, the CT value is programmable between 0 and 3, and the CC value can range between 0 and 4.

Figure 4:
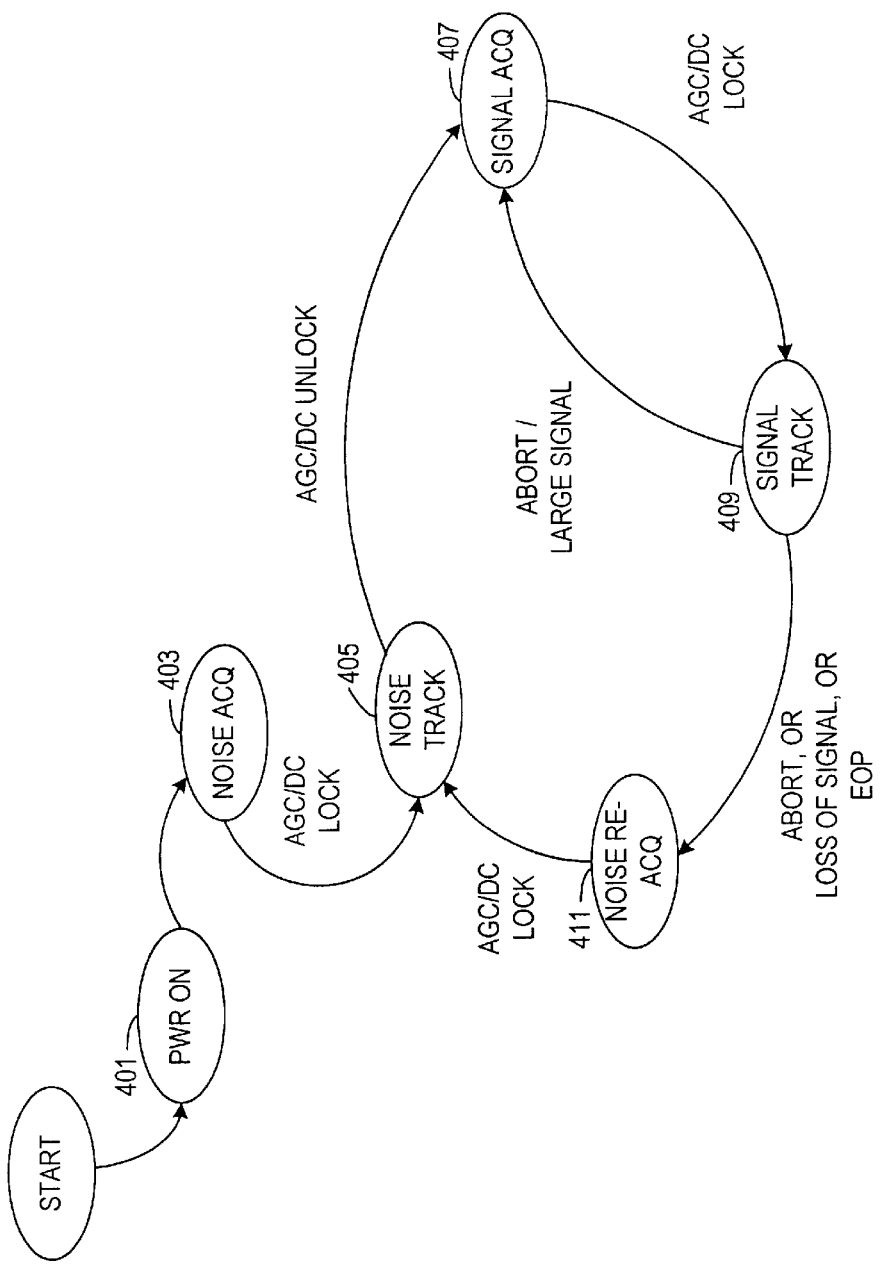
FIG. 4 is a state diagram illustrating general operation of the AGC control function of the baseband processor of FIG. 1 for controlling the gain of the ZIF receiver front end to facilitate acquisition of signals transmitted in the wireless medium.

FIG. 4 is a state diagram illustrating general operation of the AGC control function of the baseband processor 103 for controlling the gain of the ZIF receiver front end 101 to facilitate acquisition of signals transmitted in the wireless medium. A first state 401 denotes an initial power-up or reset state in which the ZIF wireless receiver 100 performs initialization functions in preparation for wireless communications. After initialization is complete, operation transitions to a noise acquisition (ACQ) state 403 in which the ZIF receiver 100 attempts to track or otherwise view the noise floor of the wireless medium. The baseband processor 103 modifies the gain in the ZIF receiver front end 101, such as by setting the gain of the LNA 117 to HI and increasing the gain of the baseband amplifier 125 to the appropriate gain setting to view the noise floor by the AGC 131. While the noise floor is being assessed, the baseband processor 103 is in an AGC/DC unlock condition. As described further below, if the noise floor is at or near the lowest expected level, the baseband processor 103 does not attempt to increase the gain level all the way to that which would otherwise be sufficient to acquire the noise floor to the target back-off power level, since the total gain of the ZIF receiver front end 101 is limited to a maximum gain level sufficient for the ADC 131 to at least view or otherwise "see" the minimum noise floor level.

When the noise floor level is acquired or otherwise when the ZIF receiver front end 101 is at its maximum gain level, an ADC/DC lock condition occurs and operation transitions to a noise track state 405. In state 405, the AGC loop 105 is released to continuously track the power level of the noise floor. Also, the DC loop 107 is operated to track and maintain DC level in the signal path of the ZIF receiver front end 101, by measuring DC offset and subtracting the measured offset at the combiner 121. Operation remains in state 405 until an AGC/DC unlock condition occurs, upon which the operation transitions to a signal acquisition state 407. The AGC/DC unlock condition in state 405 indicates the possible presence of a transmitted signal in the wireless medium. As described further below, several parameters are continuously monitored to determine transmitted signal presence, including the overload condition, a saturation condition of the ADC 131, or a signal trigger (ST) condition denoting an increase of power from the noise floor level of at least a signal trigger threshold amount. The overload condition is indicated by assertion of the OVD signal (or by a sufficient number of assertions of the OVD signal for filtered embodiments). The saturation condition is indicated by assertion of the SF signal. The signal threshold amount is arbitrarily determined to identify signal presence, such as a 4–6 dB rise in power above the noise floor power tracked in state 405, and is referred to herein as an ST condition.

In state 407, the AGC control function modifies the gain of the receive chain signal path, if necessary, in an attempt to acquire the detected signal. Acquisition is achieved when the power level of the signal path is sufficient to enable the operative baseband processing logic (e.g., CCK processor 109 or OFDM processor 111) to demodulate and decode the received signal and retrieve accurate information and/or data contained therein. If the signal power level is sufficiently high, the AGC loop 105 operates to reduce the gain level to a target back-off power level. In one embodiment, for example, the AGC loop 105 is configured such that the signal of interest has an average signal level of 12 dB below full-scale of the ADC 131 to provide sufficient resolution and head-room, and to provide optimal bit-sizing for the CCK processor 109 and/or the OFDM processor 111. If the signal power level is relatively weak such that the target back-off power level is not achieved when the total gain of the signal path is at a maximum gain level, then the AGC loop 105 is configured to maintain the maximum gain level, and the AGC/DC control logic 141 asserts the GDADJ signal to the digital gain amplifier 135 to make up the gain deficiency for the downstream processors.

It is noted that the appropriate or desired back-off level depends upon signal type, signal strength and operative signal data throughput. Packet error rate (PER) performance versus back-off is different for each waveform. For example, an OFDM signal at the 6 Mbps rate may have an acceptable back-off range of between 3 and 24 dB given the resolution of the ADC 131, whereas an OFDM signal at the 54 Mbps rate may require a back-off range between 11 and 14 dB. In the exemplary embodiments illustrated, the maximum gain level is determined, at least in part, to minimize DC instability while achieving acceptable or otherwise optimal gain to maintain visibility of the ADC 131 given its effective resolution. It is not necessary, for example, to increase the gain above the maximum gain level to acquire a relatively weak 6 Mbps OFDM signal at a 20 dB back-off level, since it is within the acceptable back-off range. It is not advantageous to increase the gain above the maximum gain level in an attempt to acquire a relatively weak 54 Mbps OFDM signal at a 20 dB back-off level, since increasing the gain will not ensure acquisition of the signal but will possibly result in DC instability. The digital gain amplifier 135 digitally boosts whatever signal is available to the target back-off level and it is left for the higher level processing systems (e.g., CCK, OFDM processors, MAC, etc.) to attempt to acquire or otherwise drop the signal.

When the target back-off power level is achieved or otherwise when the gain setting of the baseband amplifier 125 is at its maximum gain setting while in state 407, the AGC/DC lock condition occurs and operation transitions to a signal track state 409 in which the "acquired" signal is tracked. In state 409, the AGC and DC loops 105, 107 are released to track and control gain and DC levels for processing by the downstream baseband processing logic. Operation transitions from state 409 back to state 407 in the event a larger (e.g., more powerful) signal than the one currently being tracked is transmitted in the wireless medium. If a stronger signal is detected, the signal tracking of the weaker signal is aborted and the stronger signal is acquired in state 407. Operation transitions from state 409 to a noise re-acquisition state 411 in the event tracking of the current signal is aborted, if the signal is lost for whatever reason, or when EOP occurs as indicated by assertion of the RXPE signal. Operation in state 411 is similar to that of state 403, except that stored parameters associated with a prior noise floor level (e.g., immediately prior to the last packet), such as noise floor power level (and optionally DC level), are retrieved as initial conditions in an attempt to obtain the noise floor level more quickly. When the noise floor is again acquired in state 411 and AGC/DC lock occurs, operation transitions back to state 405 to track the noise floor. During normal operation, the ZIF wireless receiver 100 loops between states 405–411.

Figure 5:
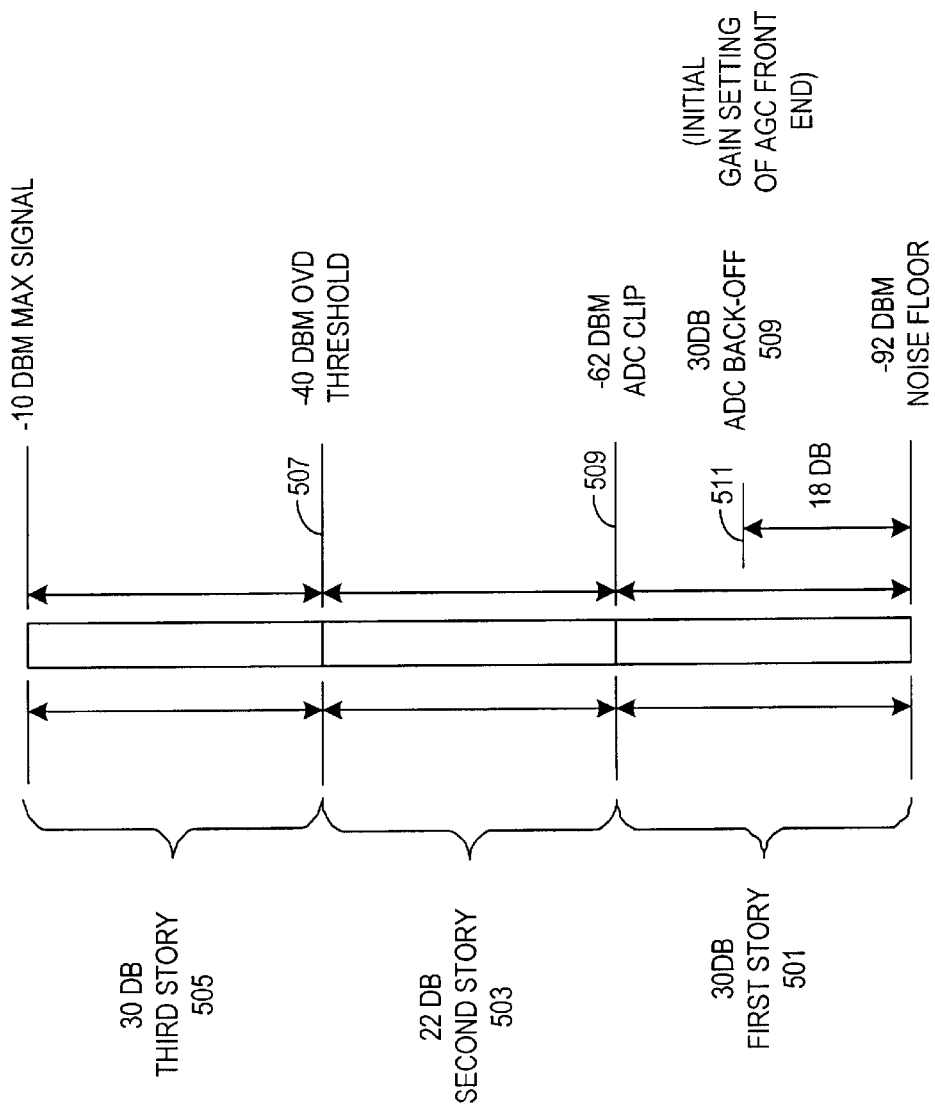
FIG. 5 is a figurative block diagram illustrating exemplary division of an operable power range or spectrum of the ZIF wireless receiver of FIG. 1 in accordance with an exemplary embodiment of the present invention.

FIG. 5 is a figurative block diagram illustrating exemplary division of an operable power range or spectrum of the ZIF wireless receiver 100 in accordance with an exemplary embodiment of the present invention. The total receiver front end dynamic range is approximately 82 dBm ranging between a largest expected input signal power level of −10 dBm relative to a minimum noise floor power level of approximately −92 dBm. It is observed that using an ADC with an effective resolution of 7 bits enables relatively quick and sufficiently accurate power measurements within a 30 dB range. In this manner, the overall power range is divided into ranges of 30 dB or less to allow the signal to be visible by the ADC 131 with sufficient resolution to enable relatively quick or otherwise accurate power and/or DC measurements when the gain of the ZIF receiver front end 101 is within 30 dB of the signal. The total power range is divided into three ranges, or stories 501, 503 and 505, which exploit the dynamic range and resolution characteristics of the ADC 131. The OV detector 133 and the ADC saturation detector 137 are used to initially identify the power range within which the signal resides.

A first power range is a 30 dB first story 501 spanning the lowest power range between the minimum noise floor level of −92 dBm up to a power level of −62 dBm. A third power range is a 30 dB third story 505 spanning the highest 30 dB range of the power range between −10 dBm and −40 dBm. With the OV detector 133 set at a threshold of −40 dBm, as shown at 507, the AGC/DC control logic 141 can quickly determine that an input signal is in the third story 505 by monitoring the OVD signal. This leaves a middle power range 22 dB second story 503 between −40 dBm and −62 dBm. The second story resides between the OVD signal threshold setting of −40 dBm and a −62 dBm ADC clip or saturation level shown at 509. If the ADC 131 saturates as indicated by the SF signal and the OVD signal is not asserted, then the AGC/DC control logic 141 can quickly determine the input signal is in the second story 503 power range.

Given the ADC 131 visibility of 30dB in the embodiment shown, the initial gain of the signal path of the ZIF receiver front end 101 is initially set up to a maximum gain level of approximately 70 dB allows the ADC 131 to view and track the minimum noise floor power level approximately 22 dB below it (e.g. −92 dBm). In the present embodiment, this gain is achieved by setting the LNA 117 to a HI gain of approximately 32 dB and setting the baseband amplifier 125 to a maximum gain setting of approximately 38 dB. Prior configurations, given a noise floor level of about −90 dBm and an LNA HI gain setting of approximately 32 dB, would set the baseband amplifier gain at 50 dB or greater in an attempt to acquire the minimum noise floor within the target back-off power level. It has been determined, however, that setting the noise floor gain level at such a high level requires a significant and even excessive number of gain steps to avoid excessive DC in any given gain change step to prevent saturation of the ADC 131 and loss of loop control. DC error exponentially increases with linear change in amplifier gain in ZIF architectures. Such excessive number of iterative steps required a substantial amount of time, precluding the ability to acquire faster signals and/or shorter preambles, such as those associated with the 802.11a standard.

Rather than attempt to acquire a low noise floor, it has been observed that it is sufficient for the ADC 131 to be able to view and track the noise floor rather than acquire it. In other words, it is sufficient if the AGC control, looking through the ADC 131, is able to at least see the noise floor rather than acquire it. Based on observations of visibility of the ADC 131, a noise floor back-off of up to 30 dB is sufficient to see the noise floor given that the effective number of bits is 7. In experimental observations, it is determined that, given the LNA HI gain of approximately 32 dB, a maximum gain setting for the baseband amplifier 125 of 38 dB is the most sensitive gain setting for getting to and viewing the noise floor. This lower gain setting has several advantages. First, the lower gain maximum avoids the problematic high gain settings that would otherwise generate excessive DC for gain changes. Second, the lower gain maximum enables the baseband amplifier 125 to be switched to the higher gain stories 503 ad 505 in one gain step, ultimately acquiring the signal in a fewer number of steps for faster signal acquisition.

The AGC/DC control logic 141 continuously monitors the SPE signal to determine if a signal is present. A rise in the power level measured by the SPE signal above the noise floor of a predetermined level determines a possible signal present. In the illustrated embodiment, the AGC/DC control logic 141 determines that a rise in power above the actual noise floor by a signal trigger threshold amount of 4–6 dB, called the SF condition, indicates a possible signal, and responds with a signal acquisition attempt.

Although a back-off of 30 dB is usable to monitor the input signal power and noise floor, it is ideally desired to reach the target back-off power level to accurately acquire signals. The ADC 131 clip level at −62 dBm is shown at 507. A 12 dB back-off from this power level is approximately −74 dBm, which is approximately 18 dB above the minimum noise floor as shown at 511. Assuming this initial gain setting while viewing the noise floor, the LNA 117 and the baseband amplifier 125 can be switched quickly to within the operative range of the ADC 131 without violating the available DC budget. The ability to get the ADC 131 to within the proper 30 dB power range of the input signal in one step and to achieve the target back-off power level in fewer steps greatly improves signal acquisition speed. In the present embodiment, once an overload or saturation condition is detected, the gain of the ZIF receiver front end 101 is switched to the operative story 501–505 and the baseband processor 103 is able to make a first power measurement in approximately 0.8 μs. Thereafter, relatively accurate gain and DC level measurements are made in successive steps to more accurately adjust the AGC and DC loops 105, 107 to acquire the input signal within the target back-off power level. If the input signal is weak, the gain is not switched above the maximum gain level. Instead, relatively accurate DC and power measurements are made to view and track the potential signal.

Figure 6:
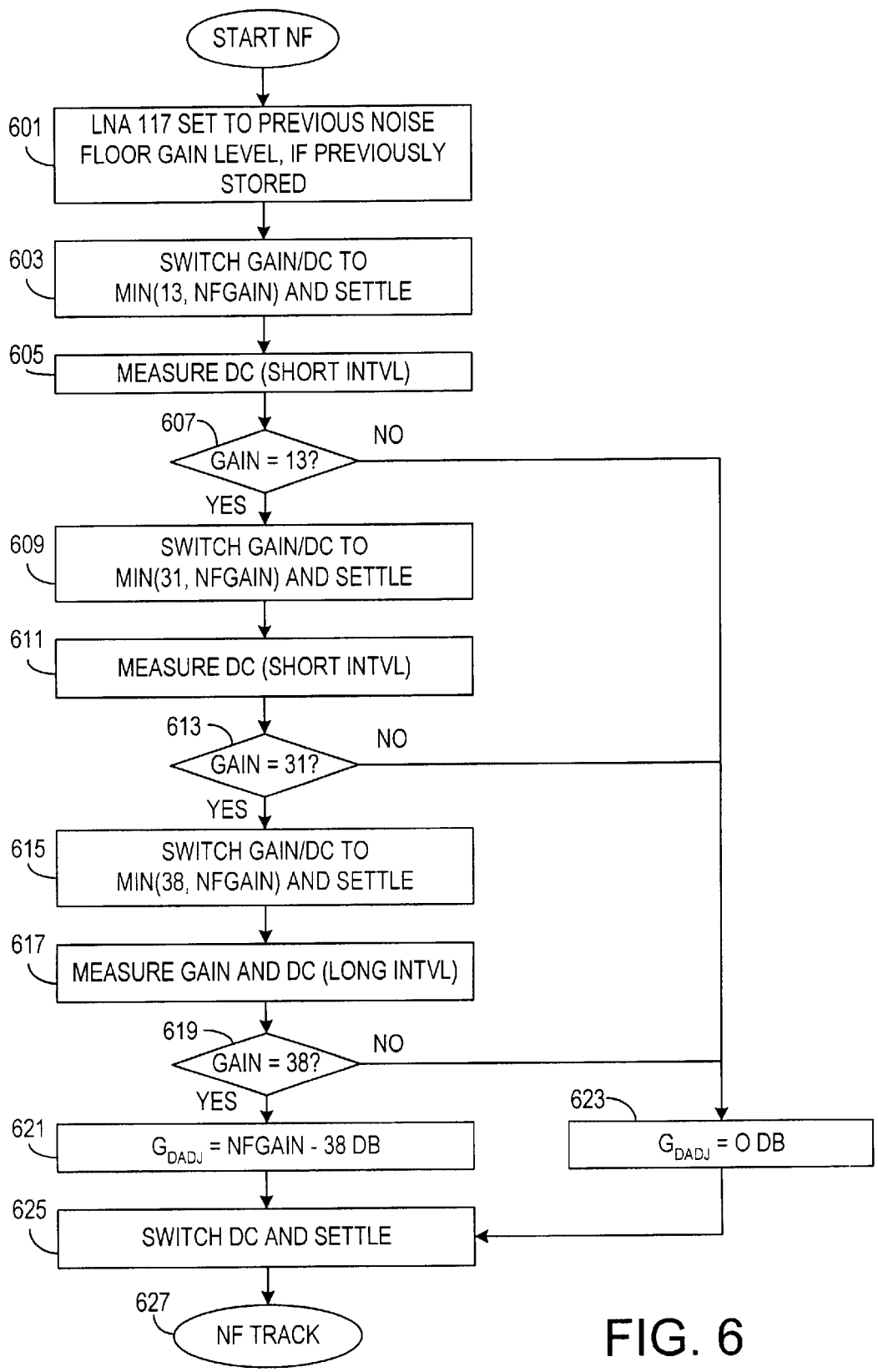
FIG. 6 is a flowchart diagram illustrating operation of the AGC/DC control logic of FIG. 1 according to an exemplary embodiment used to obtain the noise floor of the wireless medium.

FIG. 6 is a flowchart diagram illustrating operation of the AGC/DC control logic 141 according to an exemplary embodiment used to obtain the noise floor of the wireless medium. The flowchart diagram illustrates operation while in the states 403 or 411 of FIG. 4 for getting to, obtaining or otherwise "acquiring" the noise floor level. At a first block 601, the LNA 117 is set to its setting for the previous noise floor gain level, if its state was previously stored. Normally, the LNA 117 is set to HI gain given that the noise floor will usually be below 32 dB. At block 603, the AGC/DC control logic 141 switches the gain setting of the baseband amplifier 125 gain to the lesser of ("MIN" is the minimum function) either the previous gain setting (NFGAIN), if previously stored, or a gain setting of 13 dB. In this case, the gain setting of the baseband amplifier 125 is directly set via the GSET signals. If a DC level parameter had been previously stored, the AGC/DC control logic 141 retrieves the DC level parameter and the DC OFFSET signal is set via the DSET signals. If prior parameters associated with the previous noise floor are not stored or otherwise not available, default values may be used. After switching the gain and DC offsets, a delay time of 800 ns is allowed for settling the AGC and DC loops 105, 107 to allow for signal transitioning.

The particular gain setting of 13 dB for the baseband amplifier 125 is specific to the particular baseband amplifier 125 being used and is a first gain setting when transitioning from low gain, such as 0 dB, to a high gain, such as the maximum gain setting of 38 dB in the specific embodiment illustrated. The particular gain settings used when transitioning from one gain to another depends on the corresponding amount of DC error introduced for each gain step, and also depends on the particular ADC being used and its full scale voltage range. In this manner, the particular gain settings described herein may vary based on design choice and implementation details. The primary factor in determining the appropriate gain step values is the DC budget for the ADC 131, or the maximum allowable change in DC in response to gain change of the baseband amplifier 125. The particular gain step values may also be different depending on other variables of the signal path of the ZIF receiver front end 101, such as the state of the LNA 117. In the specific embodiment shown, when the gain of the baseband amplifier 125 is transitioning from 0 dB to a high gain to get to the noise floor after the LNA 117 is switched to HI gain assuming a full scale of 0.5 V for the ADC 131, the allowable gain steps are: 0 dB to 13 dB, 13 dB to 31 dB, 31 dB to 42 dB, 42 dB to 47 dB, 47 dB to 51 dB, 51 dB to 54 dB, 54 dB to 56 dB, 56 dB to 57 dB, and so on up to 60 dB. It is appreciated that smaller gain steps are necessary at the higher gain settings given the exponential relationship between the DC error versus gain.

Referring back to FIG. 6, at next block 605, the AGC/DC control logic 141 asserts the M signal to initiate a short interval measurement, including a quick measurement of DC offset at the output of the ADC 131. The quick or short interval measurement takes only 200 ns time in the particular embodiment illustrated using 4 samples of the RD signal from ADC 131. Operation then proceeds to decision block 607 in which the AGC/DC control logic 141 determines if the gain setting is 13 dB. If not, then the prior gain setting of the baseband amplifier 125 represented by NFGAIN was less than 13 dB to acquire the prior noise floor level, and operation proceeds to block 623 described further below. If the gain is 13 dB at block 607, operation proceeds to block 609 in which the AGC/DC control logic 141 applies the measured amount of DC offset via the DCC signal to the DC loop 107 and switches the gain setting of the baseband amplifier 125 to the lesser of either NFGAIN or a gain setting of 31 dB. 31 dB is determined to be the maximum gain step from 13 dB given the particular DC budget in the embodiment shown. A delay time of 800 ns is allowed for switching and settling in a similar manner as previously described.

The AGC/DC control logic 141 then makes another short interval measurement of estimated DC offset at next block 611 after settling, requiring only 200 ns time in the particular embodiment shown. The AGC/DC control logic 141 determines in next decision block 613 whether the gain setting is 31 dB. If not, then NFGAIN is between 13 and 31 dB and operation proceeds to block 623. If the gain setting is 31 dB at block 613, operation proceeds to block 615 in which the AGC/DC control logic 141 again applies the measured amount of DC offset via the DCC signal to DC loop 107 and switches the gain setting of the baseband amplifier 125 to the lesser of either the NFGAIN gain or a gain setting of 38 dB. A delay time of 800 ns is again allowed for switching and settling.

The AGC/DC control logic 141 then makes a long interval measurement of the gain and estimated DC offset at next block 617, taking 800 ns of time. A more accurate measurement is taken at this point since it is the final measurement used to close in on the actual gain and DC offset. At next decision block 619, the AGC control logic 141 queries whether the gain setting is 38 dB, which is the maximum gain setting of the baseband amplifier 125 in the particular embodiment shown. Again, if the gain setting is not 38 dB, meaning that NFGAIN is between 31 dB and 38 dB, then operation proceeds to block 623. If the gain setting is 38 dB at block 619, meaning that NFGAIN is greater than 38 dB, then operation proceeds to block 621 at which the AGC/DC control logic 141 sets the GDADJ signal to NFGAIN −38 dB. In this case, the noise floor is not acquired at the target back-off power level since the baseband amplifier 125 is at the maximum gain setting. Operation then proceeds to next block 625, in which the AGC/DC control logic 141 applies any remaining DC offset from the last DC measurement to the DC loop 107 via the DCC signal, and allows 800 ns for settling. Operation then proceeds to next block 627, generally representing state 405 in which the AGC/DC control circuit 141 tracks the noise floor until the next AGC/DC unlock event.

If operation proceeded to block 623 from any of blocks 607, 613, or 619, then the feed forward digital gain signal GDADJ is set equal to 0 dB, and operation proceeds to block 625 previously described. In this case, the gain setting of the baseband amplifier 125 is less than the maximum gain setting (e.g., 38 dB) and the digital gain amplifier 135 is not needed to further amplify gain of the digital baseband signal RD for downstream processing.

It is appreciated that the procedure describe above for getting to the noise floor for preparing the ZIF wireless receiver 100 to detect a signal in the wireless medium is achieved relatively quickly. Each switching and settling (blocks 603, 609, 615 and 625) consumes approximately 800 ns, each short interval measurement (blocks 605, 611) consumes approximately 200 ns and the final long measurement interval (block 617) consumes another 800 ns for a total of 4.4 μs to get to the noise floor. This is true even if the baseband amplifier 125 starts at no gain of 0 dB and is switched all the way to its maximum gain setting of 38 dB for a low noise floor. Even if the noise floor is at the minimum level of −92 dBm, the ZIF wireless receiver 100 is capable of tracking the noise floor and detecting weak signals in the wireless medium. As described further below, the ZIF wireless receiver 100 is capable of detecting and acquiring a sufficiently strong signal of any of the expected signal types, including high data throughput 802.11a and 802.11g signals, having a power level anywhere within the power spectrum of FIG. 5.

Figure 7:
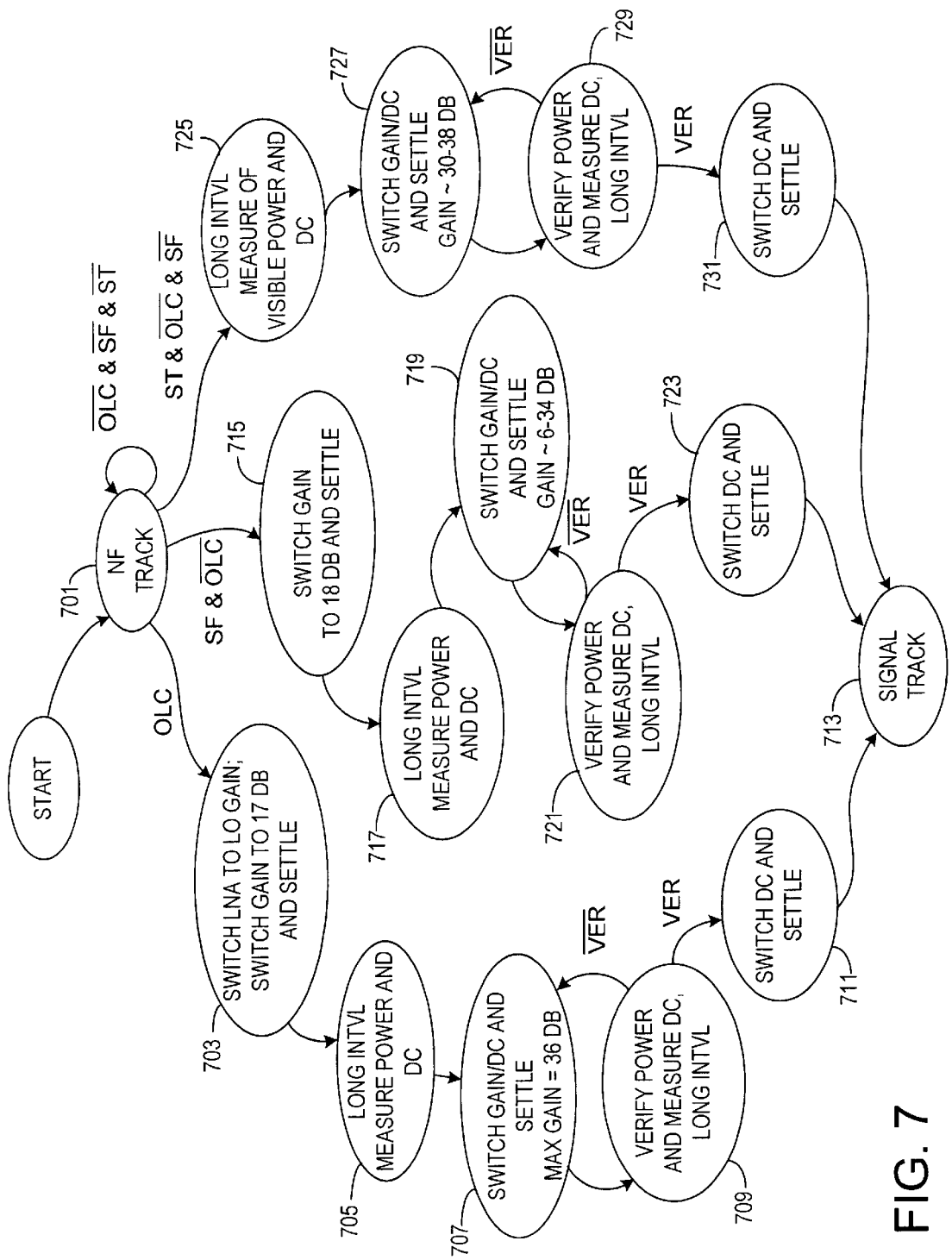
FIG. 7 is a state diagram illustrating operation of the AGC/DC control logic of FIG. 1 according to an exemplary embodiment used to acquire or otherwise view a received signal having a power level within the operable power spectrum illustrated in FIG. 5.

FIG. 7 is a state diagram illustrating operation of the AGC/DC control logic 141 according to an exemplary embodiment used to acquire or otherwise view a received signal having a power level within the operable power spectrum illustrated in FIG. 5. A state diagram is used to provide a clear description of the exemplary embodiment for signal acquisition. A name next to a transition arrow denotes detection of the condition or assertion of the corresponding signal, and a line above a name denotes that the condition is not detected or that the signal is negated or otherwise not asserted. The AGC/DC control logic 141 is in a first state 701 while tracking the noise floor, corresponding to state 405 of FIG. 4. While in state 701, the AGC/DC control logic 141 monitors three signals or conditions, including the overload condition (OLC) as indicated by assertion of the OVD signal in response to a strong signal, the SF signal indicating a medium strength signal, and the ST condition indicating an increase in the power level of the noise floor by more than the signal trigger threshold amount. The occurrence of the ST condition without detection of the OLC or assertion of the SF signal indicates a relatively weak signal. It is assumed that the LNA 117 is set to the HI gain state while in state 701 for purposes of explanation, since otherwise the noise floor level is excessively high (e.g., above −40 dBm).

The OLC is detected in response to a strong signal above a signal level of −40 dBm as detected by the overload sensor 127. In response to OLC, operation of the AGC/DC control logic 141 transitions to a state 703, where the AGC/DC control logic 141 switches the gain of the LNA 117 to LO gain (e.g., 6 dB) and switches the gain setting of the baseband amplifier 125 to 17 dB. Any specific gain setting may be achieved by a direct setting via the GSET signals. A delay occurs in state 703 to provide sufficient time for signal settling. In the embodiment shown, a delay time of approximately 800 ns is invoked to allow for settling. It is noted that the gain setting of the baseband amplifier 125 is assumed to be in the 31–38 dB range while tracking the noise floor in state 701, so that a gain switch to 17 dB is within the next lower gain setting range as previously described without exceeding the available DC budget. It is also noted, however, that the LNA 117 has been switched from HI to LO gain, so that an additional DC error is introduced somewhat reducing the available DC budget. Otherwise, the gain could be switched to a lower gain value while still within the original DC budget. The new gain of the ZIF receiver front end 101 is 23 dB including the collective gains of the LNA 117 and the baseband amplifier 125, which places the total gain towards the upper end of the third story 505 of the power spectrum.

After the settling delay time, the AGC/DC control logic 141 transitions to a state 705 in which it asserts the M signals to invoke a long interval measurement (e.g., 16 samples and 800 ns) of signal power and DC offset. After this measurement, the AGC/DC control logic 141 transitions to state 707 in which the AGC/DC control logic 141 asserts the GC and DCC signals to switch the gain and DC settings in accordance with the measured values in an attempt to acquire the new signal. A maximum gain of 36 dB is allowed in state 707 to avoid exceeding the DC budget given the LO setting of the LNA 117. A delay time of 800 ns is again invoked to allow for settling at state 707. The AGC/DC control logic 141 then transitions to state 709 to re-measure the power and DC using a long interval measurement and to verify that the signal power level is at the proper range for signal acquisition, such as at the desired target back-off power level for the ADC 131. For verification of signal power level, the AGC/DC control logic 141 determines whether the gain setting of the baseband amplifier 125 is at the proper gain setting to place the signal power within a tolerance level of the desired target back-off power level. A signal VER indicates verification of the signal power level. If verification fails for any reason, operation loops back to state 707 for gain switching and then back to state 709 to repeat measurement and verification. If the VER signal indicates successful verification of the power level, operation proceeds to state 711, in which the AGC/DC control logic 141 applies any remaining portion of DC measured in state 709, and a delay of 800 ns is invoked to allow for settling. The AGC/DC control logic 141 then transitions to state 713, corresponding to state 409, in which the signal is tracked during acquisition by downstream control logic.

Back to state 701, if the SF signal is asserted indicating saturation of the ADC 131 while the OLC is not detected, thereby indicating a medium strength signal, the AGC/DC control logic 141 transitions to a state 715. In state 715, the AGC/DC control logic 141 switches the gain of the baseband amplifier 125 to 18 dB and a delay time of 800 ns is invoked to allow for settling. The gain setting of 18 dB may be directly made via the GSET signals. The new gain setting places the total gain of the signal path to approximately 50 dB assuming HI gain of the LNA 117 at 32 dB, which is approximately in the center of the second story 503 of the power spectrum. After the settling delay, the AGC/DC control logic 141 transitions to a state 717, in which a long interval measurement of power and DC is made. After the measurement in state 717 is complete, operation transitions to a state 719 in which the AGC/DC control logic 141 switches the appropriate gain and DC levels, followed by another 800 ns delay time for settling. The new gain setting of the baseband amplifier 125 is limited to the range of 6 to 34 dB, which corresponds to a power spectrum gain range of −38 dBm to 66 dBm overlapping the power boundaries of the second story 503. After settling, the AGC/DC control logic 141 transitions to state 721 at which the power and DC are re-measured using the long interval measurement, and the signal power level is verified in a similar manner as described above for state 709. If the signal power level fails verification, operation loops back to state 719 and then back to state 721 for additional switching, measuring and power verification in a similar manner as described above for states 707 and 709. Upon signal power level verification, the AGC/DC control logic 141 transitions to state 723, in which the AGC/DC control logic 141 applies any remaining portion of DC measured in state 721, and a delay of 800 ns is invoked to allow for settling. The AGC/DC control logic 141 then transitions to state 713 previously described.

Back to state 701, if the ST condition occurs and the OLC is not detected and the SF signal is not asserted indicating a potential weak signal, the AGC/DC control logic 141 transitions to a state 725, at which a long interval power and DC measurement is made. After the measurement is completed in state 725, which again is about 800 ns in the embodiment shown, operation transitions to a state 727 in which the AGC/DC control logic 141 switches the gain of the baseband amplifier 125, if necessary, and applies the DC offset measured in state 725. As previously indicated, if the signal is sufficiently weak such that signal acquisition to the target back-off power level would require a gain greater than the maximum gain setting, the gain is not switched but remains at the maximum. Otherwise, the gain is switched within a range of 30–38 dB in state 727, where the minimum gain setting of 30 dB corresponds to the boundary of the first story 501 (LNA 117 at HI gain of 32 dB plus 30 dB gain is 62 dB, corresponding to the saturation power level shown at 509). After switching and settling in state 727, the AGC/DC control logic 141 transitions to a state 729 to re-measure power and DC offset and to verify whether the total gain places the signal at the target back-off power level or otherwise is at the maximum gain setting. If verification fails, operation loops back to state 727 and then back to state 729 for additional switching, measuring and power verification in a similar manner as described above for states 707 and 709. Upon signal power level verification, the AGC/DC control logic 141 transitions to state 731, in which the AGC/DC control logic 141 applies any remaining portion of DC measured in state 729, and a delay of 800 ns is invoked to allow for settling. The AGC/DC control logic 141 then transitions to state 713 previously described.

It is appreciated that signal acquisition from state 701 to state 713 occurs sufficiently quickly to acquire any expected signal type, including those according to 802.11a, b and g, as long as the signal strength is sufficient for the given signal type. The state transition path for the strong signal (OLC) has a duration of up to approximately 4.8 µs for most cases. The OLC is detected earlier in the signal path, and is usually detected within the first 800 ns after signal onset. Each switch and settle state and each long interval measurement (states 703–711) is approximately 800 ns in the embodiment shown, for a total of six 800 ns periods totaling 4.8 µs. The available time budget is not exceeded even if the OLC is not detected until up to 1.6 µs, since the total acquisition time is only 5.6 µs, still within the available time budget of 6.4 µs. Assuming the OLC is detected within 800 ns, even if verification fails in state 709 causing an additional time penalty of 1.6 µs for repeat of states 707 and 709, the total acquisition time is 6.4 µs, which is acceptable. It is possible that if the OLC is delayed by more than 800 ns and if verification fails, that signal acquisition might fail, but this circumstance is considered very rare and within acceptable performance limits.

The state transition path for the medium strength signal (ADC saturation) has a duration of up to approximately 5.6 µs for most cases. The detection of saturation of the ADC 131 will normally occur within 1.6 µs after signal onset. Each switch and settle state and each long interval measurement (states 715–723) is approximately 800 ns in the embodiment shown, for a total of seven 800 ns periods totaling 5.6 µs. Assuming saturation is detected within 800 ns of signal onset, even if verification fails in state 721 causing an additional time penalty of 1.6 µs for repeat of states 719 and 721, the total acquisition time is 6.4 µs, which is acceptable. It is possible that if saturation detection consumes up to 1.6 µs and if verification fails in state 721, that signal acquisition might fail, but this circumstance is considered very rare and within acceptable performance limits.

The state transition path for the ST condition has a duration of up to approximately 4.8 µs for most cases. The detection of the ST condition will normally occur within 1.6 µs after signal onset. Each switch and settle state and each long interval measurement (states 725–731) is approximately 800 ns in the embodiment shown, for a total of six 800 ns periods totaling 4.8 µs. Even if the ST condition consumes a full 1.6 µs after signal onset and verification fails in state 729 causing an additional time penalty of 1.6 µs for repeat of states 727 and 729, the total acquisition time is 6.4 µs, which is acceptable.

It is appreciated that the AGC/DC control logic 141 is operative to employ full utilization of visibility of the ADC 131 in order to limit the gain of the baseband amplifier 125 to a maximum gain setting to avoid excessive gain settings that could lead to DC instability. The maximum gain setting is determined to enable visibility of the minimum noise floor level and to allow the ADC 131 to view a received signal after a single gain step of the baseband amplifier 125 to place total gain within an applicable segment of the full power spectrum. The amount of the gain step depends upon the strength of the received signal and the available DC budget. An overload condition is detected for strong signals, and the baseband amplifier 125 is switched to place total gain within an upper power segment of the full power spectrum to view and ultimately acquire the signal. The gain step in this case also contemplates switching of the LNA 117 from HI to LO gain. A saturation condition is detected for medium-strength signals, and the baseband amplifier 125 is switched to place total gain within a middle power segment of the full power spectrum to view and ultimately acquire the signal. A signal trigger condition is detected for relatively weak signals that do not cause the overload or saturation conditions. In this case, if the baseband amplifier 125 is already at its maximum gain setting, it is switched only if the signal is strong enough to reduce gain to achieve the target back-off power level of the ADC 131. Otherwise, the gain state remains static and DC and long interval power measurements are made to view the power level of the signal. The digital gain amplifier 135 is employed to boost gain of the digital baseband signal if necessary for optimal power level expected by downstream processing logic.

The AGC/DC control logic 141 employs limited gain stepping of the baseband amplifier 125 to avoid exceeding available DC budget at any given time. The AGC/DC control logic 141 controls the measurement interval of the BB processor DC offset and signal power estimator 139, including a short interval for fast and rough measurements and a long interval for longer and more accurate measurements. The short interval measurements are used, for example, to quickly assess DC while gain stepping the baseband amplifier 125 after initialization or after a prior signal acquisition to obtain the actual noise floor. The long interval measurements are used, for example, to more accurately measure the actual noise floor level and during gain stepping after signal onset.

As described previously, the wireless receiver 100 is the receive portion of a wireless transceiver. FIG. 8A is a simplified block diagram of a ZIF wireless transceiver 801 configured as an expansion unit for coupling to a host system 803 via an appropriate expansion slot or interface (I/F) on the host system 803. The ZIF wireless transceiver 801 includes an antenna 805, a ZIF front end (FE) radio 807 coupled to the antenna 805, a baseband processor (BBP) 809 coupled to the ZIF FE radio 807, a media access device (MAC) 811 coupled to the BBP 809, and a communications I/F 815 coupled to the MAC 811. The ZIF receiver front end 101 and the baseband processor 809 represent applicable portions of the ZIF FE 807 and BBP 809, respectively. The communications I/F 813 is configured to be compatible for plugging into or otherwise interfacing the expansion slot 815. For example, the ZIF wireless transceiver 801 may be implemented as a PC Card according to PCMCIA or the like, where the expansion slot 815 is a corresponding PC Card or PCMCIA slot of the host system 803 configured as a laptop computer or the like. Alternatively, the ZIF wireless transceiver 801 may be implemented as an ISA card or PCI card for plugging into the expansion slot 815 configured as either an ISA slot or PCI slot, respectively, of a desktop computer system. The host system 803 is not limited to computer systems, but may be any type of electronic device in which it is desired to expand with wireless communication capabilities.

The expansion slot 815 enables communication between the ZIF wireless transceiver 801 and a processor 817 (e.g., microprocessor) of the host system 803 via appropriate bus structure 821 and bridge circuitry 832. The host system 803 also may include appropriate memory 819 coupled via the bus structure 821, such as any appropriate combination of volatile memory devices (e.g., RAM) and non-volatile memory devices (e.g., ROM, EEPROM, FLASH, magnetic/optical drives, etc.).

Figure 8B:
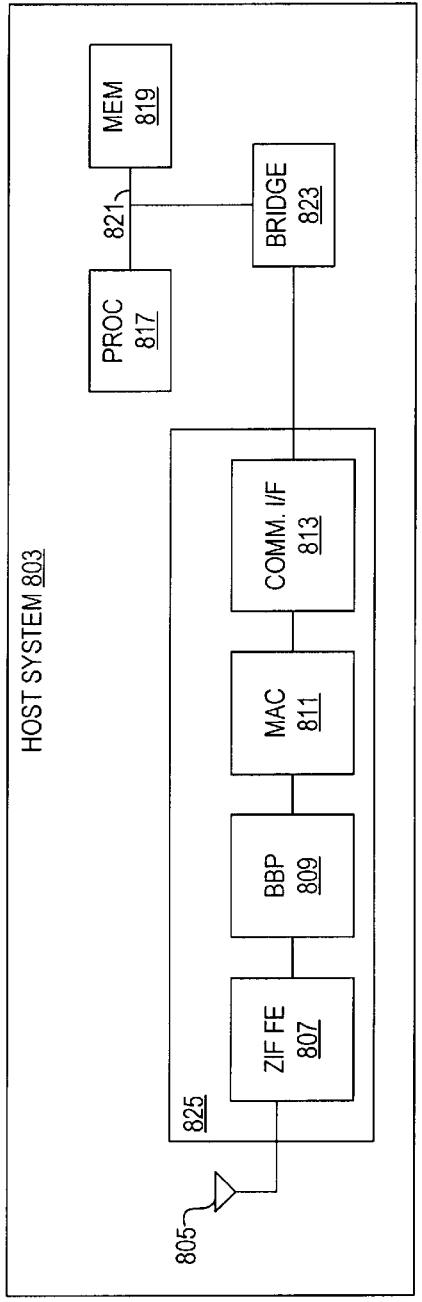
FIG. 8B is a simplified block diagram of a ZIF wireless transceiver integrated a host computer system.

FIG. 8B is a simplified block diagram of a ZIF wireless transceiver 825 configured in a similar manner as the ZIF wireless transceiver 801 except integrated on the host system 803, such as, for example, being incorporated on the motherboard or primary circuit board or the like. A recent trend is to incorporate wireless communications on laptop computers or the like. The ZIF wireless transceiver 825 is particularly advantageous for battery-powered configurations given higher data rate capacity and lower power consumption.

Figure 8C:
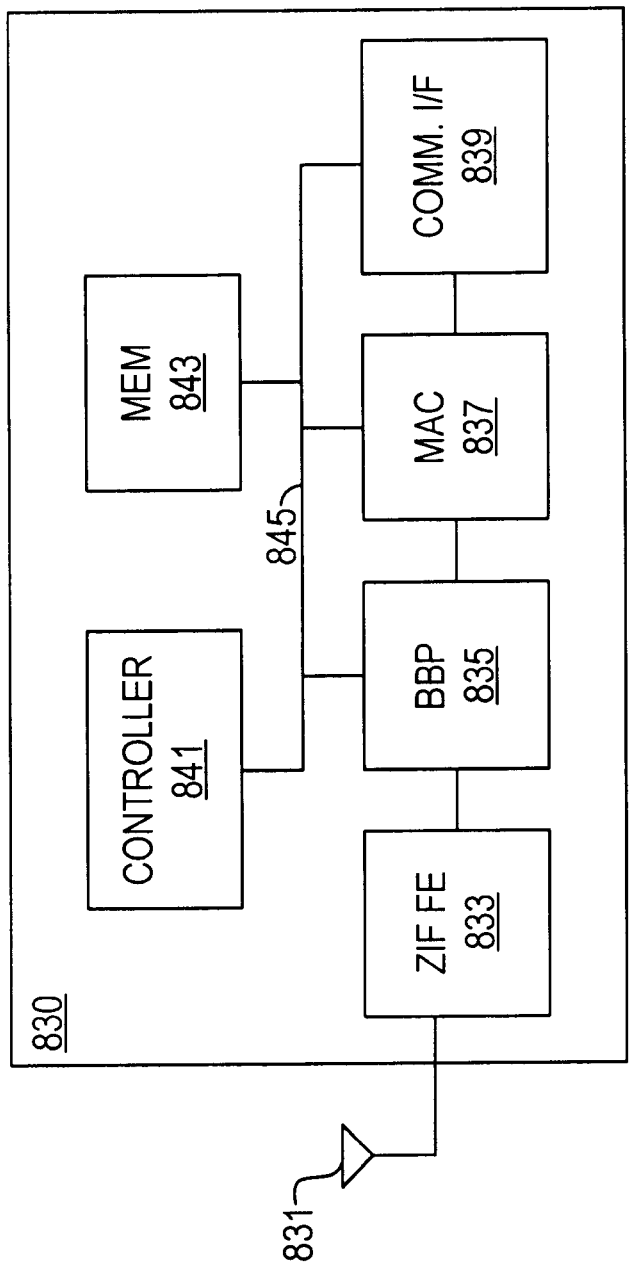
FIG. 8C is a simplified block diagram of a ZIF wireless transceiver configured as a stand-alone unit, such as an access point (AP) or the like as known to those of ordinary skill in the art.

FIG. 8C is a simplified block diagram of a ZIF wireless transceiver 830 configured as a stand-alone unit, such as an access point (AP) or the like as known to those of ordinary skill in the art. The ZIF wireless transceiver 830 includes similar functions as the ZIF wireless transceiver 801, including an antenna 831 coupled to a ZIF FE 833, which is coupled to a BBP 835, which is coupled to a MAC 837, which is coupled to a communications I/F 839. The ZIF receiver front end 101 and the baseband processor 809 represent applicable portions of the ZIF FE 833 and BBP 835, respectively. In this case, the communications I/F 839 is configured to communicate with a host system or the like via a WAN connection, such as any combination of a 10/100 Ethernet interface, a USB interface, a serial port, etc. The ZIF wireless transceiver 830 further includes a controller 841 or the like coupled to the BBP 835, the MAC 837 and the communications I/F 839 via an appropriate bus structure 845. A memory 843 may be provided and coupled via the bus structure 845, where the memory 843 includes suitable volatile and/or nonvolatile memory devices.

Although a system and method according to the present invention has been described in connection with one or more preferred embodiments, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A method of controlling amplification of a signal received by a ZIF radio having a power level within a predetermined full power range relative to a predetermined minimum noise floor, comprising:
    amplifying the received signal using a baseband amplifier with a plurality of gain settings;
    converting the received signal to a digital signal using an analog to digital converter (ADC); and
    controlling said amplifying of the received signal for tracking noise floor and for attempting to acquire the received signal while limiting DC change within an available DC budget of the ADC, said controlling comprising:
        obtaining actual noise floor level by setting gain up to a maximum gain level within a first story power range at a lower end of the full power range sufficient for the ADC to view the minimum noise floor;
        detecting an overload condition and switching gain in a single gain step to within a third story power range at an upper end of the full power range sufficient for the ADC to view the received signal; and
        detecting a saturation condition of the ADC and switching gain in a single gain step to within a second story power range between the first and second story power ranges sufficient for the ADC to view the received signal.

2. The method of claim 1, wherein said obtaining actual noise floor level comprises switching the baseband amplifier up to a predetermined maximum gain setting using limited gain stepping to avoid exceeding the DC budget of the ADC.

3. The method of claim 2, further comprising:
    settling after each said switching;
    after each said settling, measuring DC of the digital signal and subtracting measured DC from the received signal; and
    after a final of said switching and settling, measuring power level of the digital signal.

4. The method of claim 3, wherein each occurrence of said measuring DC before a last occurrence of said measuring DC comprises short interval measurements and wherein the last occurrence of said measuring DC and said measuring power level comprises a long interval measurement.

5. The method of claim 2, wherein said amplifying the received signal comprises using an RF amplifier with high and low gain settings and wherein said obtaining an actual noise floor level includes switching the RF amplifier to its high gain setting.

6. The method of claim 1, further comprising:
    detecting a signal trigger condition in which power level is increased over the actual noise floor by at least a predetermined signal trigger threshold;
    measuring power level and DC level of the digital signal in response to detecting any one of the overload, saturation and signal trigger conditions;
    if measured power level of the digital signal is greater than a predetermined target back-off power level of the ADC, switching the baseband amplifier and subtracting DC from the received signal and settling;
    verifying power level and measuring DC level of the digital signal; and
    subtracting any remaining DC offset from the received signal and settling.

7. The method of claim 6, further comprising:
    said verifying power level comprising measuring power level of the digital signal and comparing with a target back-off power level for the ADC; and
    if the digital signal power level is outside tolerance of the target back-off power level, switching the baseband amplifier towards the target back-off power level up to its maximum gain setting and settling again, and repeating said verifying power level.

8. The method of claim 7, wherein each said measuring power level and DC level of the digital signal comprises a long interval measurement.

9. The method of claim 6, further comprising digitally amplifying the digital signal to achieve a power level equivalent to the target back-off power level of the ADC if the baseband amplifier is at its maximum gain setting and the power level of the digital signal is less than the target back-off power level of the ADC.

10. The method of claim 6, further comprising:
    said amplifying the received signal comprising using an RF amplifier with high and low gain settings; and
    switching the RF amplifier to its low gain setting in response to said detecting an overload condition.

11. A ZIF radio for detecting an RF signal within a predetermined power spectrum relative to a predetermined minimum noise floor, comprising:
    a ZIF receiver front end that converts the RF signal to a baseband signal and that includes a baseband amplifier;
    an overload detector, coupled to said ZIF receiver front end, that detects an overload condition of said ZIF receiver front end in which said RF signal is within an upper power range of a predetermined power spectrum and that asserts an overload signal indicative thereof;
    an analog to digital converter (ADC), coupled to said ZIF receiver front end, that converts said baseband signal to a digital baseband signal;
    a saturation detector, coupled to said ADC, that detects a saturation condition of said ADC in which said RF signal is within a middle power range of the power spectrum and that provides a saturation signal indicative thereof;
    a DC and power estimator, coupled to said ADC, that estimates DC and power level of said digital baseband signal and that provides estimation signals indicative thereof; and
    control logic, coupled to said saturation detector, said overload detector and said DC and power estimator and operatively coupled to said ZIF receiver front end via AGC and DC loops, that limits gain of said baseband amplifier to a maximum gain setting sufficient for said ADC to view a lower power story including the minimum noise floor of the power spectrum, that monitors said saturation, overload and estimation signals, and that switches gain of said baseband amplifier once to place the received signal within view of said ADC in the event of either one of said overload and saturation conditions.

12. The control system of claim 11, wherein said ZIF receiver front end comprises:
an RF amplifier having high and low gain settings for amplifying the RF signal;
a mixer, coupled to said RF amplifier, that converts said RF signal to said baseband signal;
a DC combiner, coupled to said mixer, that subtracts a DC offset from said baseband signal; and
wherein said overload detector is coupled to said RF amplifier for detecting said an overload condition, and wherein said control logic is operative to switch said RF amplifier to its low gain setting in the event of said overload condition.

13. The control system of claim 12, further comprising a digital amplifier, coupled to said control logic and said ADC, that is controlled by said control logic to digitally amplify said digital baseband signal to obtain a target back-off power level of the ADC if the digital baseband signal is less than said target back-off power level and the baseband amplifier is at said maximum gain setting.

14. The control system of claim 11, wherein the control logic is operative to command said DC and power estimator to make a short interval measurement for speed and to make a long interval measurement for accuracy.

15. The control system of claim 14, wherein said control logic is operative to obtain an actual noise floor level upon initialization or after prior signal acquisition by switching gain of said baseband amplifier up to said maximum gain setting and delaying for settling after each switching, by commanding a short interval measurement of DC offset after each of initial gain switches and a long interval measurement of power and DC after a last gain switching, and by subtracting a measured DC offset via said DC combiner for each gain switching.

16. The control system of claim 15, wherein said control logic delays by approximately 800 nanoseconds for each settling, wherein said short interval measurement is approximately 200 nanoseconds and wherein said long interval measurement is approximately 800 nanoseconds so that said actual noise floor level is obtained within approximately 4.4 microseconds.

17. The control system of claim 14, wherein said control logic is operative to acquire said baseband signal after said overload condition is detected by switching gain of said baseband amplifier once to place total gain within said upper power range and then delaying for settling, by commanding a long interval measurement of DC and power, by again subtracting DC offset and switching gain and delaying for settling, and by commanding another long interval measurement of DC and power for power verification and subtracting any additional DC offset and delaying for settling.

18. The control system of claim 17, further comprising:
said ZIF receiver front end further comprises an RF amplifier having high and low gain settings for amplifying the RF signal; and
said control logic further operative to switch said RF amplifier to said low gain setting after said overload condition is detected.

19. The control system of claim 17, wherein said control logic is operative to acquire said baseband signal after said saturation condition is detected by first switching gain of said baseband amplifier once to place total gain within said middle power range and delaying for settling, by commanding a long interval measurement of DC and power, by again subtracting DC offset and switching gain and delaying for settling, and by commanding another long interval measurement of DC and power for power verification and subtracting any additional DC offset and delaying for settling.

20. The control system of claim 19, further comprising:
a digital amplifier, coupled to said control logic and said ADC;
wherein said control logic is operative to attempt to acquire said baseband signal after detection of a signal trigger condition in which the power level of said baseband signal increases above a signal trigger threshold, by commanding a long interval measurement of DC and power, by subtracting DC offset and switching gain if necessary for signal acquisition and delaying for settling after switching, and by commanding another long interval measurement of DC and power for power verification and subtracting any additional DC offset and delaying for settling; and
wherein if said baseband signal is amplified less than a target back-off level of said ADC when said baseband amplifier is at said maximum gain setting, said control logic is operative to control said digital amplifier to further amplify said digital baseband signal.

21. The control system of claim 20, wherein said control logic is operative to repeat subtracting DC offset and switching gain and delaying for settling in the event power verification fails and repeating said commanding another long interval measurement of DC and power for power verification and subtracting DC offset and delaying for settling.

22. The control system of claim 20, wherein said overload condition is detected within approximately 800 nanoseconds of signal onset, wherein said saturation and signal trigger conditions are detected within approximately 1.6 microseconds of signal onset, and wherein said long interval measurement is approximately 800 nanoseconds so that said baseband signal is acquired within approximately 6.4 microseconds.

23. A processing system with wireless communications, comprising:
a processor;
a memory coupled to said processor; and
a ZIF transceiver, communicatively coupled to said processor, that detects RF signals within a predetermined full power spectrum, comprising:
a ZIF receiver front end including a low noise amplifier (LNA), a DC subtractor and a baseband amplifier;
an analog to digital converter (ADC), coupled to said ZIF receiver front end, that converts said baseband signal to a digital baseband signal;
a saturation detector, coupled to said ADC, that detects a saturation condition of said ADC indicative of a medium-powered signal;
an overload detector, coupled to said ZIF receiver front end, that detects an overload condition of the baseband signal indicative of a strong signal;
a joint DC and power estimator, coupled to said ADC, that estimates DC and power level of said digital baseband signal; and
AGC/DC control logic, coupled to said ZIF receiver front end, said overload detector, and said joint DC and power estimator, that employs full utilization of visibility of said ADC to limit gain of said baseband amplifier to a maximum gain setting and to segment said full power spectrum based on said overload and saturation conditions, and that employs limited gain stepping to avoid exceeding a DC budget of said ADC when switching gain of said baseband amplifier.

24. The processing system of claim 23, wherein said AGC/DC control logic controls said joint DC and power estimator to make a short interval measurement for speed and to make a long interval measurement for accuracy.

25. The processing system of claim 23, wherein said AGC/DC control logic controls gain of said ZIF receiver front end to perform each of a plurality of tasks within 6.4 microseconds, said tasks including obtaining actual noise floor and signal acquisition.

26. The processing system of claim 23, wherein said ADC has a visible power range of approximately 30 decibels.

27. The processing system of claim 23, wherein said ZIF transceiver is implemented as an expansion unit for coupling to a host system incorporating said processor and memory.

28. The processing system of claim 27, wherein said host system comprises a computer system.

29. The processing system of claim 23, wherein said processor, memory and ZIF transceiver collectively implement a standalone unit.

30. The processing system of claim 29, wherein said standalone unit comprises a wireless access point.

* * * * *